(12) United States Patent
Freitag et al.

(10) Patent No.: US 7,602,589 B2
(45) Date of Patent: Oct. 13, 2009

(54) MAGNETORESISTIVE SENSOR HAVING SHAPE ENHANCED PINNING AND LOW LEAD RESISTANCE

(75) Inventors: James Mac Freitag, Sunnyvale, CA (US); Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 441 days.

(21) Appl. No.: 11/513,479

(22) Filed: Aug. 30, 2006

(65) Prior Publication Data

US 2008/0055794 A1    Mar. 6, 2008

(51) Int. Cl.
    *G11B 5/127*    (2006.01)
    *G11B 5/33*    (2006.01)
(52) U.S. Cl. .............................. 360/324.11; 360/324.12
(58) Field of Classification Search ............. 360/324.11, 360/324.12
    See application file for complete search history.

(56) References Cited

U.S. PATENT DOCUMENTS

| RE34,099 E | 10/1992 | Krounbi et al. ............. 360/113 |
| 5,862,022 A | 1/1999 | Noguchi et al. ............ 360/113 |
| 5,905,611 A | 5/1999 | Yoda et al. ............... 360/113 |
| 6,385,016 B1 | 5/2002 | Van Ek et al. ............. 360/322 |
| 6,433,971 B1 | 8/2002 | Sato et al. ............... 360/322 |
| 6,762,915 B2 | 7/2004 | Pokhil et al. ............ 360/324.11 |
| 6,816,345 B1 | 11/2004 | Knapp et al. ............. 360/322 |
| 7,436,638 B1 * | 10/2008 | Pan ..................... 360/324.11 |
| 2002/0051328 A1 | 5/2002 | Hasegawa ................. 360/322 |
| 2002/0154451 A1 | 10/2002 | Dimitrov et al. ........... 360/317 |
| 2003/0058585 A1 | 3/2003 | Shoji .................... 360/322 |
| 2004/0207960 A1 | 10/2004 | Saito et al. .............. 360/324.1 |

FOREIGN PATENT DOCUMENTS

| JP | 61013415 | 1/1986 |
| JP | 9022510 | 1/1997 |
| JP | 2002353538 | 12/2002 |
| JP | 2003030807 | 1/2003 |

\* cited by examiner

*Primary Examiner*—Andrea L Wellington
*Assistant Examiner*—Gustavo Polo
(74) *Attorney, Agent, or Firm*—Zilka-Kotab, PC

(57) ABSTRACT

A magnetoresistive sensor having a pinned layer that extends beyond the free layer in the stripe height direction for improved shape enhanced pinning. The sensor includes hard bias layers and leads that extend in the stripe height direction beyond the stripe height of the free layer, providing increased conductive material for improved conduction of sense current to the sensor. The hard bias layers contact the sensor stack in the region between the ABS and the stripe height of the free layer, but are electrically insulated from the pinned layer in regions beyond the stripe height of the free layer by a layer of conformally deposited non-magnetic, electrically insulating material such as alumina.

14 Claims, 26 Drawing Sheets

MAGNETORESISTIVE SENSOR HAVING SHAPE ENHANCED PINNING AND LOW LEAD RESISTANCE

FIELD OF THE INVENTION

The present invention relates to magnetoresistive sensors and more particularly to the construction of magnetoresistive sensor having a pinned layer extended in the stripe height direction for improved shape enhanced pinning and having a novel lead structure for reduced lead resistance.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is oriented parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another scattering is minimal, and when the magnetizations of the pinned and free layer are antiparallel scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP pinned spin valve includes first and second magnetic layers separated by a thin nonmagnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

The push for ever increased data rate and data capacity has lead a drive to make magnetoresitive sensors ever smaller. For example, designing a sensor with a narrower track width means that more tracks of data can be fit onto a given area of magnetic medium. The various dimensions of a sensor must scale together, so if the trackwidth is decreased, then the stripe height dimension (perpendicular to the ABS) must also be decreased. As sensors become ever smaller, one problem that arises is that the pinned layer becomes impracticably unstable. In fact, future generation sensors will very soon become so small that the pinned layer cannot be pinned by current pinning mechanisms. This has to do with the size of the pinned layer, which makes the pinned layer itself hard to pin, as well as the reduced area on which traditional pinning mechanisms such as AFM pinning, AP coupling, and magnetostriction induced anisotropy can act.

It is known that shape induced anisotropy can greatly improve the stability of the sensor. Such shape induced anisotropy could be provided by, for example, extending the pinned layer in the stripe height direction (perpendicular to the ABS) so that the pinned layer structure has a narrow deep rectangular structure.

However, such designs have been prevented by such factors as: the limitations on the stripe height dimension of the free layer (to avoid shape induced anisotropy in the wrong direction on the free layer); the need to avoid shunting of sense current across the extended portion of the pinned layer, and also by currently available photolithographic techniques, such as the alignment of multiple mask structures.

Also, in order to maximize sensor performance, it is important that sufficient sense current be delivered to the sensor. Since, the sensor measures the change in resistance across the sensor, any parasitic resistance in the lead structure results in a loss of sensor performance. This is especially problematic in very small sensor designs, since the size of the leads shrinks in proportion to the rest of the sensor, increasing the resistance in the leads.

Therefore, there is a strong felt need for a sensor design, and a method of making such a sensor that will provide a strong pinned layer anisotropy perpendicular to the ABS, such as by a design that provides a shape induced anisotropy. Such a design must not, however, result in a significant amount of current shunting. Preferably, a method for manufacturing such a sensor would overcome current photolithographic limitations involved in aligning separate mask structures which has heretofore, limited the use of such pinned layer structures. There is also a need for a sensor design that can provide adequate lead conductance for delivering a sense current to a sensor, even in a very small sensor.

SUMMARY OF THE INVENTION

The present invention provides a magnetoresistive sensor having a free layer, a pinned layer and a non-magnetic, electrically conductive spacer layer sandwiched between the free layer and the spacer layer. The free layer has a back edge that terminates at a stripe height, whereas the pinned layer extends beyond the free layer defined stripe height. First and second magnetic bias layers extend from the sides of the sensor layers, and also extend beyond the back edge (stripe height) of the free layer. The bias layers are insulated from the pinned layer in regions beyond the back edge (stripe height) of the free layer.

The hard bias layers can contact the sensor layers in the region between the ABS and the free layer defined stripe height. First and second non-magnetic, electrically insulating walls can be formed between the hard bias layer and the pinned layer in regions that extend beyond the free layer defined stripe height.

The pinned layer can extend to a distance that is equal to or greater than the stripe height of the free layer. This extension of the pinned layer advantageously provides the pinned layer with a shape induced magnetic anisotropy oriented perpendicular to the ABS. This shape induced magnetic anisotropy strongly assists in the pinning of the pinned layer.

Extending the bias layer beyond the stripe height of the free layer advantageously increases conductivity for providing a sense current to the sensor, thereby reducing parasitic resistance. Electrically conductive leads can be formed over the hard bias layers and can also extend beyond the stripe height of the free layer.

Electrically insulating the hard bias layer (and possibly the electrically conductive leads) from the pinned layer in regions beyond the free layer stripe height, prevents sense current from being shunted across the pinned layer in this inactive region of the sensor.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
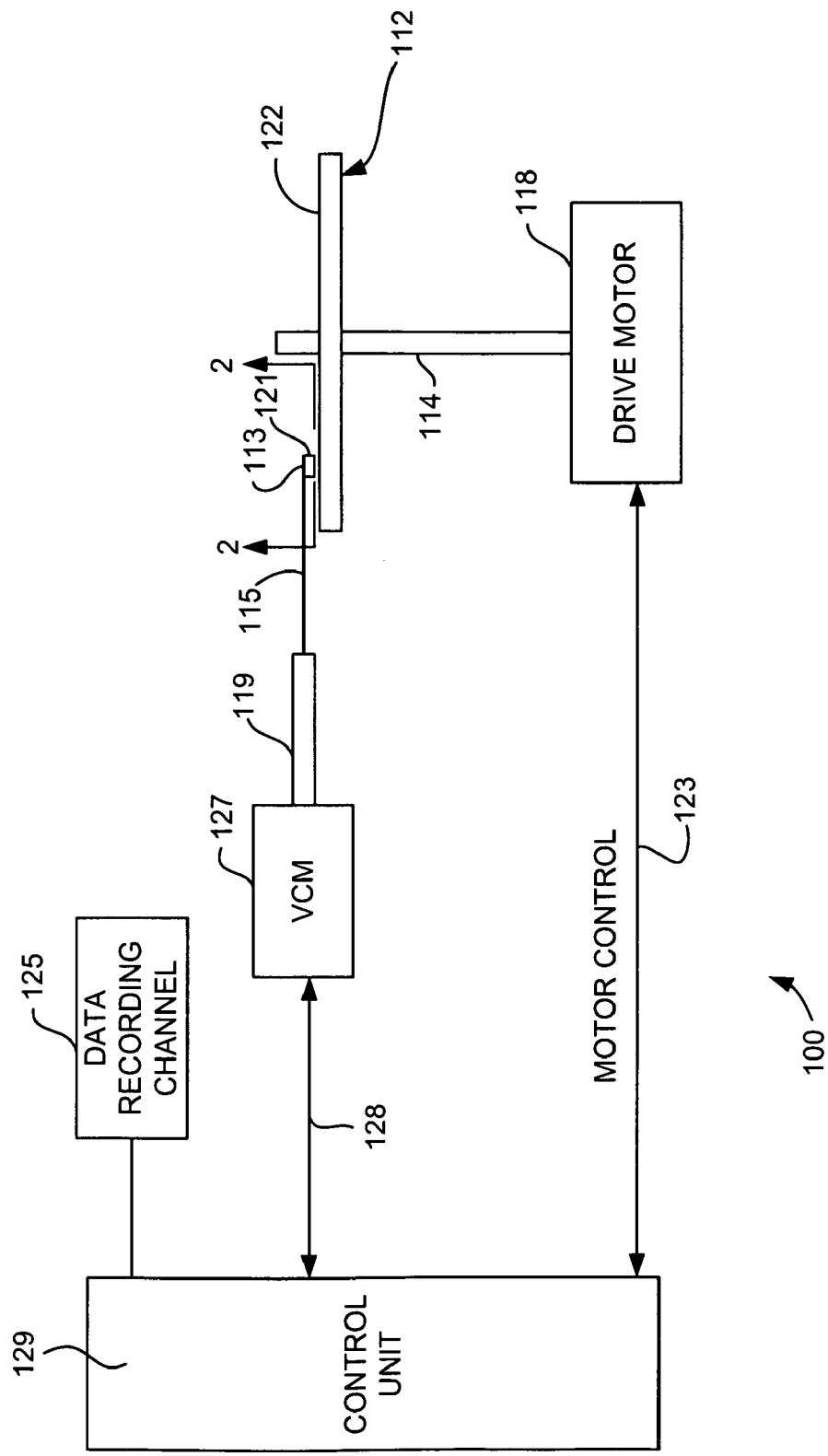
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases the slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
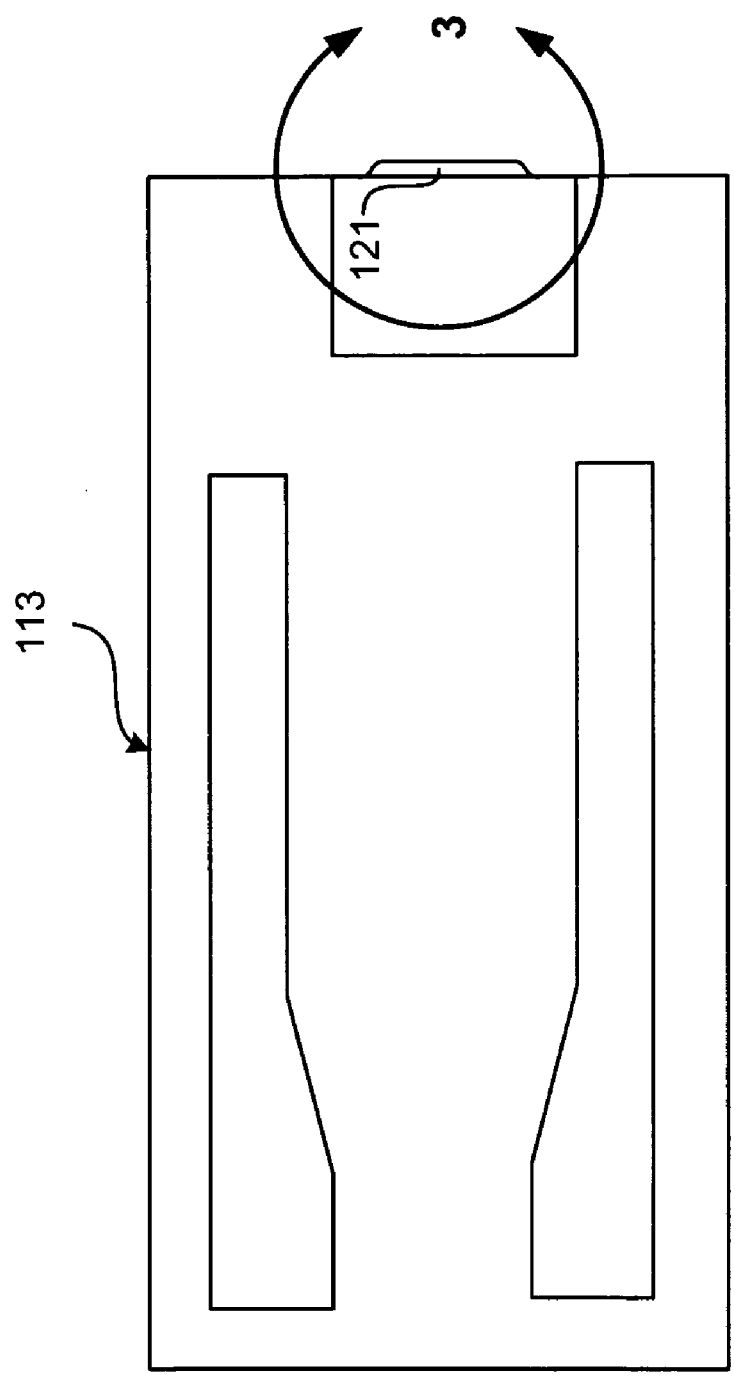
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
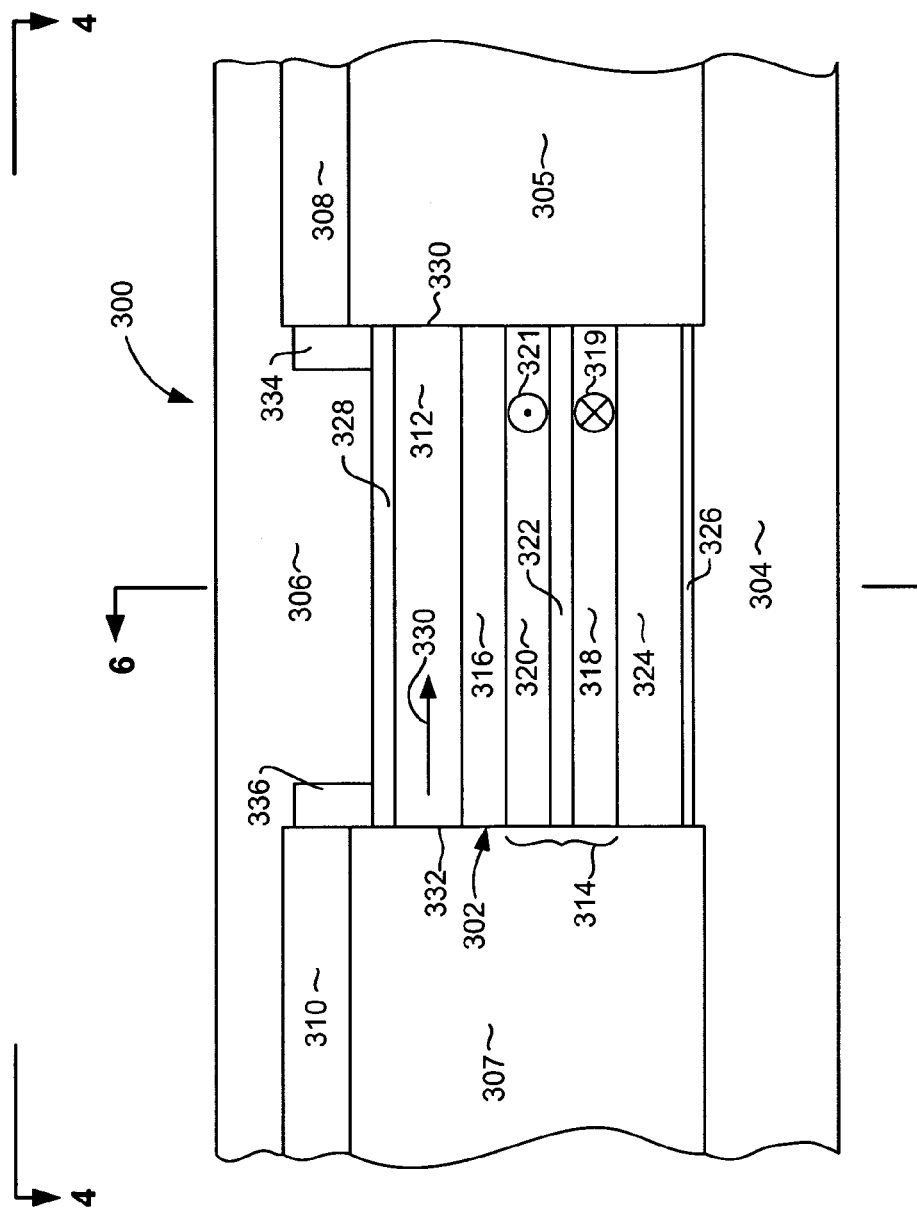
FIG. 3; is an ABS view, taken from circle 3 of FIG. 2 illustrating a sensor according to an embodiment of the invention.

With reference now to FIG. 3, a magnetoresistive sensor 300 according to an embodiment of the invention includes a magnetoresistive sensor element or sensor stack 302, sandwiched between first and second non-magnetic, electrically insulating gap layers 304, 306, which can be constructed of, for example alumina ($Al_2O_3$). First and second hard bias layers (HB) 305, 307 constructed of, for example, CoPtCr are formed at either side of the sensor to provide a magnetic bias field to bias the magnetic moment of the free layer in a direction parallel with the ABS. First and second electrically conductive lead layers 308, 310 are formed over the first and second HB layers, and extend laterally from the sides of the sensor stack 302 between the first and second gap layers 304, 306.

The sensor stack 302 includes a magnetic free layer 312, a pinned layer structure 314 and a non-magnetic, electrically conductive spacer layer 316, constructed of, for example Cu. The free layer can be constructed of several magnetic materials such as Co, CoFe, NiFe, or of a combination of layers of different magnetic materials.

The pinned layer structure 314 may be a simple pinned structure or an antiparallel pined (AP pinned) structure, and may be either self pinned or AFM pinned. For purposes of illustration, the pinned layer structure 314, will be described as an AFM pinned, AP pinned layer structure having first and second ferromagnetic layers AP1 318 and AP2 320, which are antiparallel coupled across a non-magnetic, electrically conductive AP coupling layer 322 such as Ru. The AP1 and AP2 layers 318, 320 can be constructed of, for example CoFe, NiFe or some combination of these or other materials. A layer of antiferromagnetic material (AFM layer) 324 is disposed beneath the pinned layer structure 314, and can be for example PtMn, IrMn or some other antiferromagnetic material. The AFM layer 324 is exchange coupled with the first magnetic layer 318 and strongly pins the magnetic moments of the AP1 and AP2 layers 318, 320 in a direction perpendicular to the ABS as indicated by symbols 319, 321.

The sensor stack 302 also may include a seed layer 326 formed at the bottom of the sensor stack 302, which can be used to initiate a desired crystalline growth in the layers of the sensor stack 302. A capping layer 328, such as for example Ta or some other suitable material may be provide at the top of the sensor stack 302 to protect the layers of the sensor stack from damage during manufacturing processes such as annealing. The sensor stack 302 has first and second lateral sides 330, 332 that define the track width (TW) of the sensor. The free layer 312 has a magnetic moment 330 that is biased in a desired direction parallel with the ABS. Biasing of the moment 330 is achieved by a bias field provided by the first and second hard bias layers 305, 307. First and second non-magnetic, electrically insulating side wall portions 334, 336 are provided at the top of the sensor stack 302 at either side, and are preferably constructed of alumina. The purpose of these side walls 334, 336 will become apparent upon further reading of this detailed description.

Figure 4:
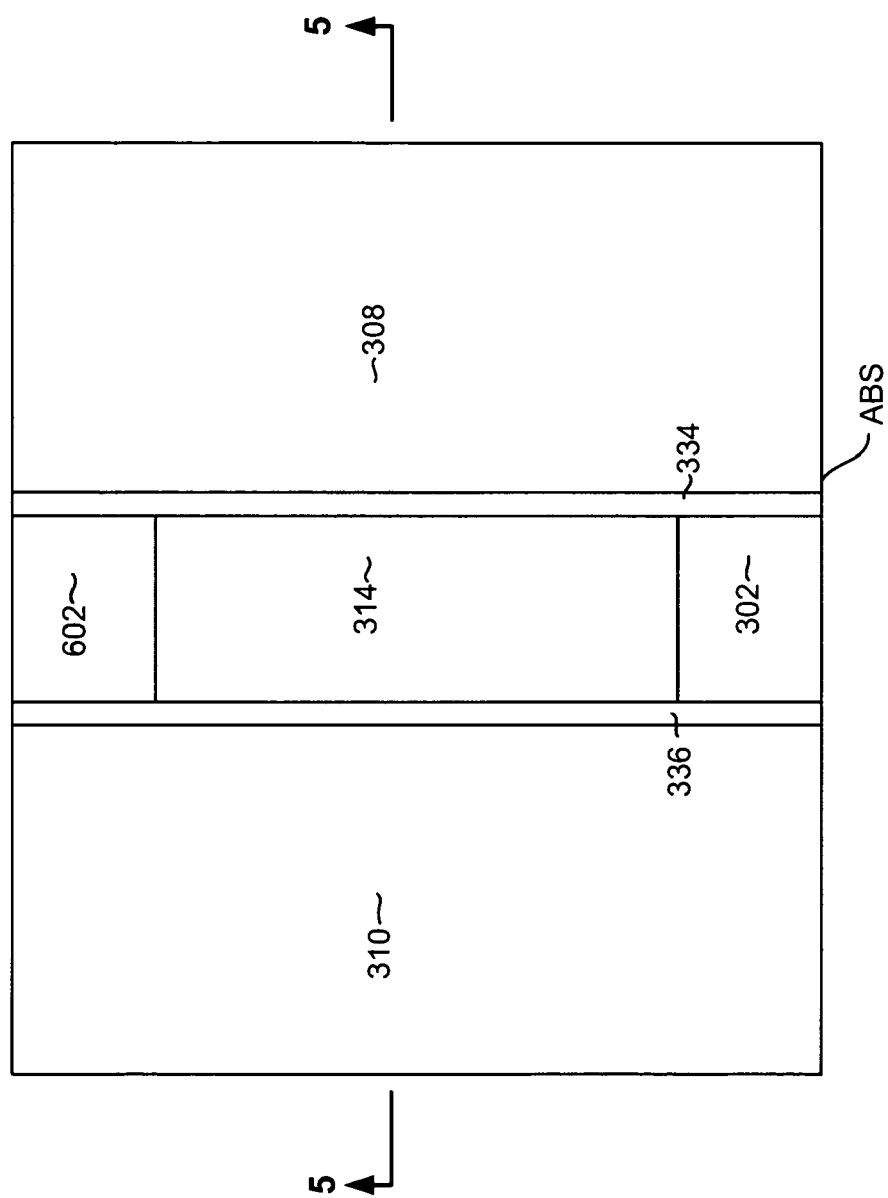
FIG. 4 is a top down view, taken from line 4-4 of FIG. 3.
Figure 5:
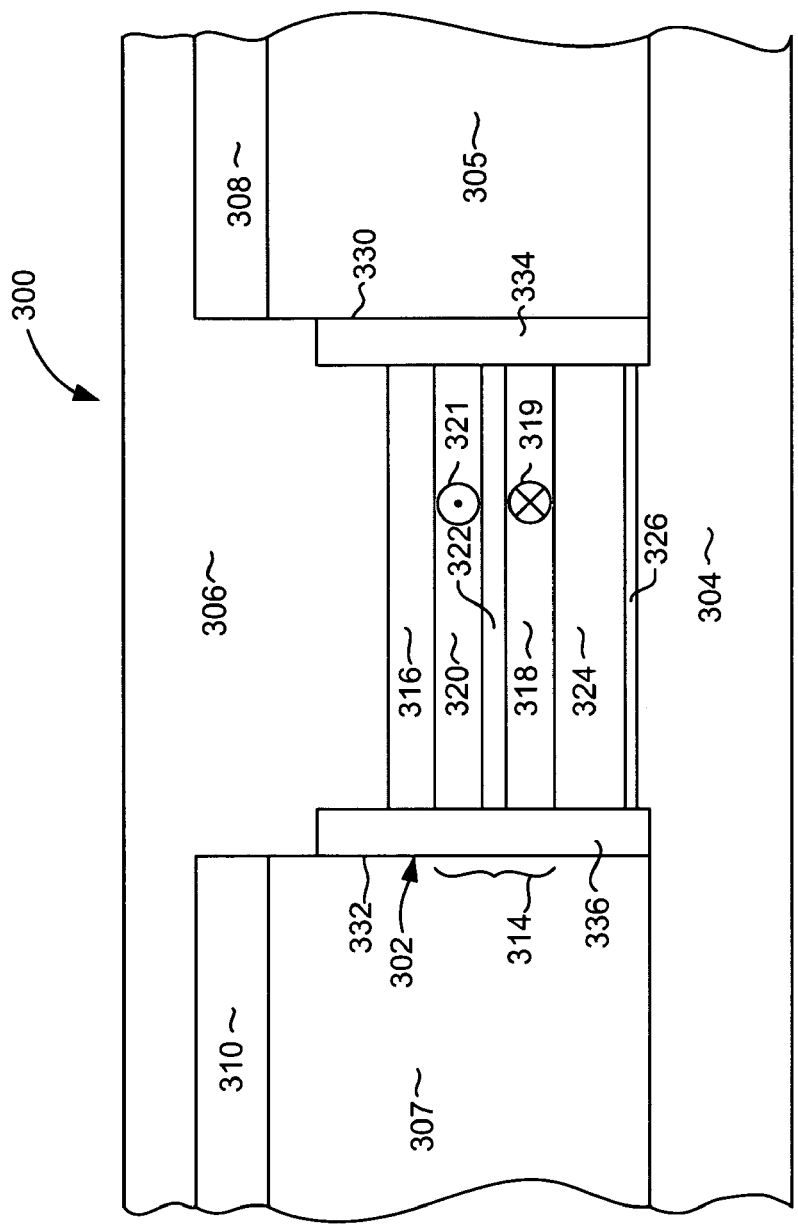
FIG. 5 is a view taken from line 5-5 of FIG. 4.
Figure 6:
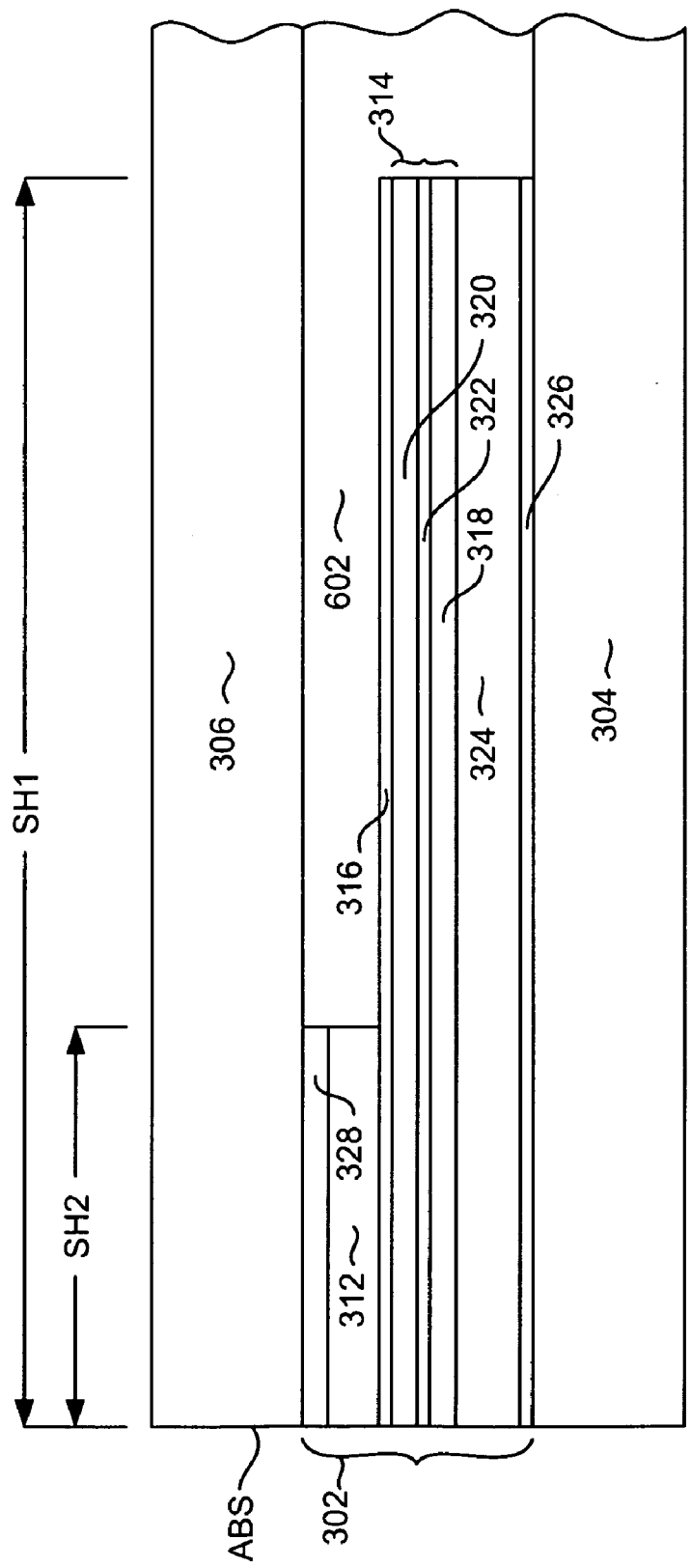
FIG. 6 is a side cross sectional view taken from line 6-6 of FIG. 5.

With reference to FIG. 4, a top view of the sensor 300 is shown with the top gap layer 306 (FIG. 3) removed to reveal that the pinned layer 314 extends beyond the rest of the sensor stack 302 in the stripe height direction. This can be seen more clearly with reference to FIGS. 5 and 6. With reference to FIG. 6 it can be seen that the pinned layer 314 extends to a first stripe height distance SH1 as measured from the ABS. The free layer 312 and capping layer 328, however, extend to a second stripe height distance SH2, also measured from the ABS, SH2 being much smaller than SH1. All or a portion of the spacer layer 316 can extend to either the first stripe height SH1 or the second stripe height SH2.

This extended stripe height of the pinned layer 314 provides a strong magnetic anisotropy in a direction perpendicular to the ABS, which greatly increases the pinning field of the pinned layer 314. This makes the pinned layer 314 very robust. The shorter stripe height of the free layer, on the other hand, provides the necessary free layer magnetic response necessary for proper sensor function.

With continued reference to FIG. 6, the space above and behind the pinned layer 314 is filled with a non-magnetic, electrically insulating fill layer 602, such as alumina. With reference to FIG. 5, it can be seen that the pinned layer 314 and spacer layer 316 have first and second side walls that are covered with the non-magnetic, electrically insulating side walls 334, 336. These insulating side walls allow the bias and lead structures 305, 307, 308, 310 to be constructed thick and to extend beyond the stripe height SH2 of the free layer 312, while also preventing any of the sense current from being shunted through the pinned layer 314, spacer layer 316 or AFM layer 324 in this inactive region beyond SH2. This allows the bias and lead layers 305, 307, 308, 310 to be constructed so as to provide a very low lead resistance, thereby reducing parasitic resistance from the leads and bias structures. It can seen that the insulating side walls (hereinafter referred to as alumina side walls 334, 336) extend down across the sides of the spacer 316, pinned layer 314 and AFM layer 324 in the region beyond SH2, but set on top of the sensor stack 302 in the region between the ABS and SH2 (as seen in FIG. 3).

Figure 7:
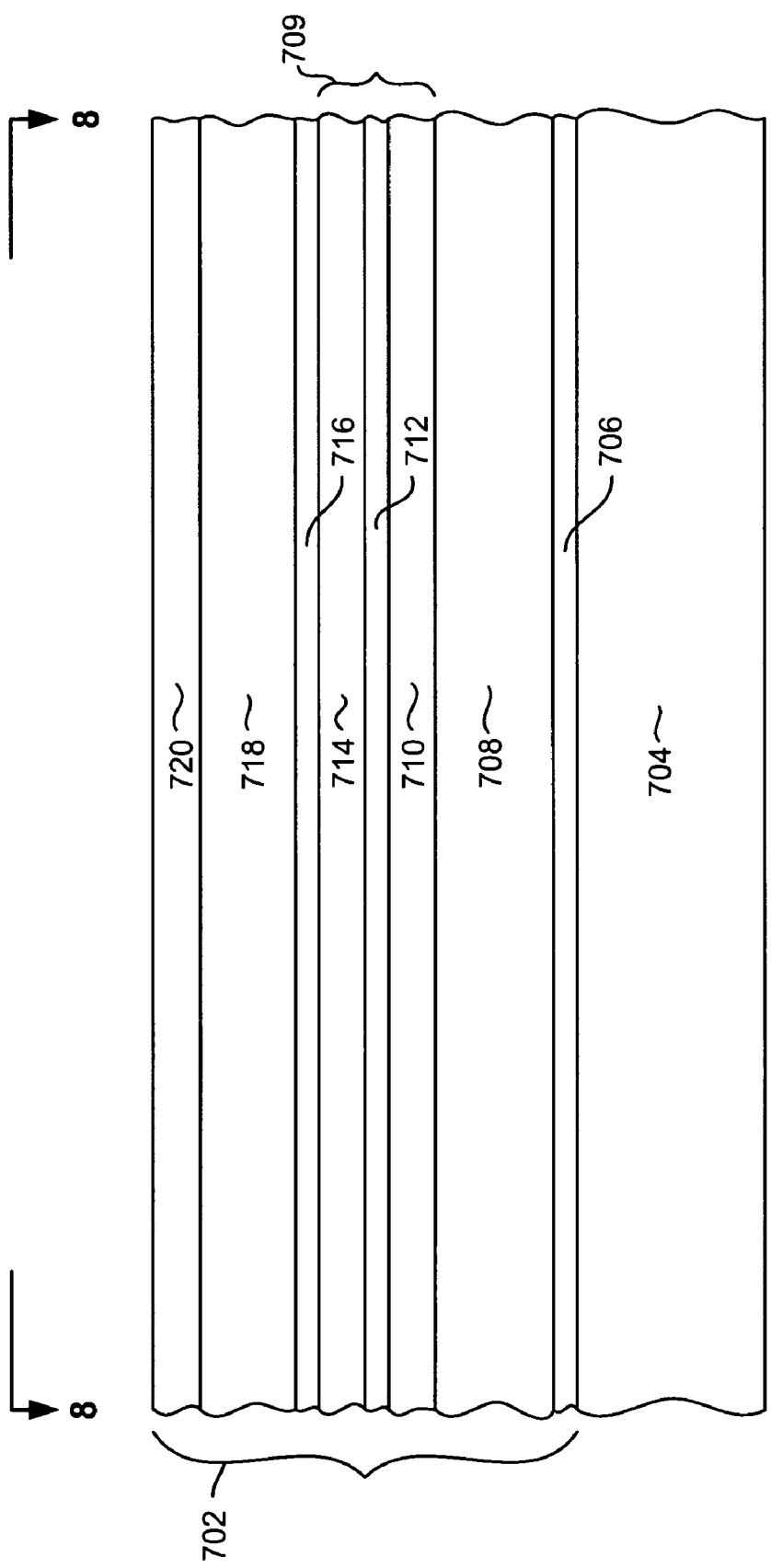
FIGS. 7-26 are views of a magnetoresistive sensor in various intermediate stages of manufacture illustrating a method of manufacturing a sensor according to an embodiment of the invention.

With reference now to FIGS. 7-26, a method for constructing a magnetoresistive sensor according to an embodiment of the invention is described. With particular reference to FIG. 7, a plurality of sensor layers 702 are deposited over a substrate 704. The substrate 704 can be an alumina gap layer. The sensor layers can include: a seed layer 706; an AFM layer 708, a pinned layer 709 (that may include an AP1 layer 710, a coupling layer 712 and an AP2 layer 714); a spacer layer 716; free layer 718; and capping layer 720.

Figure 8:
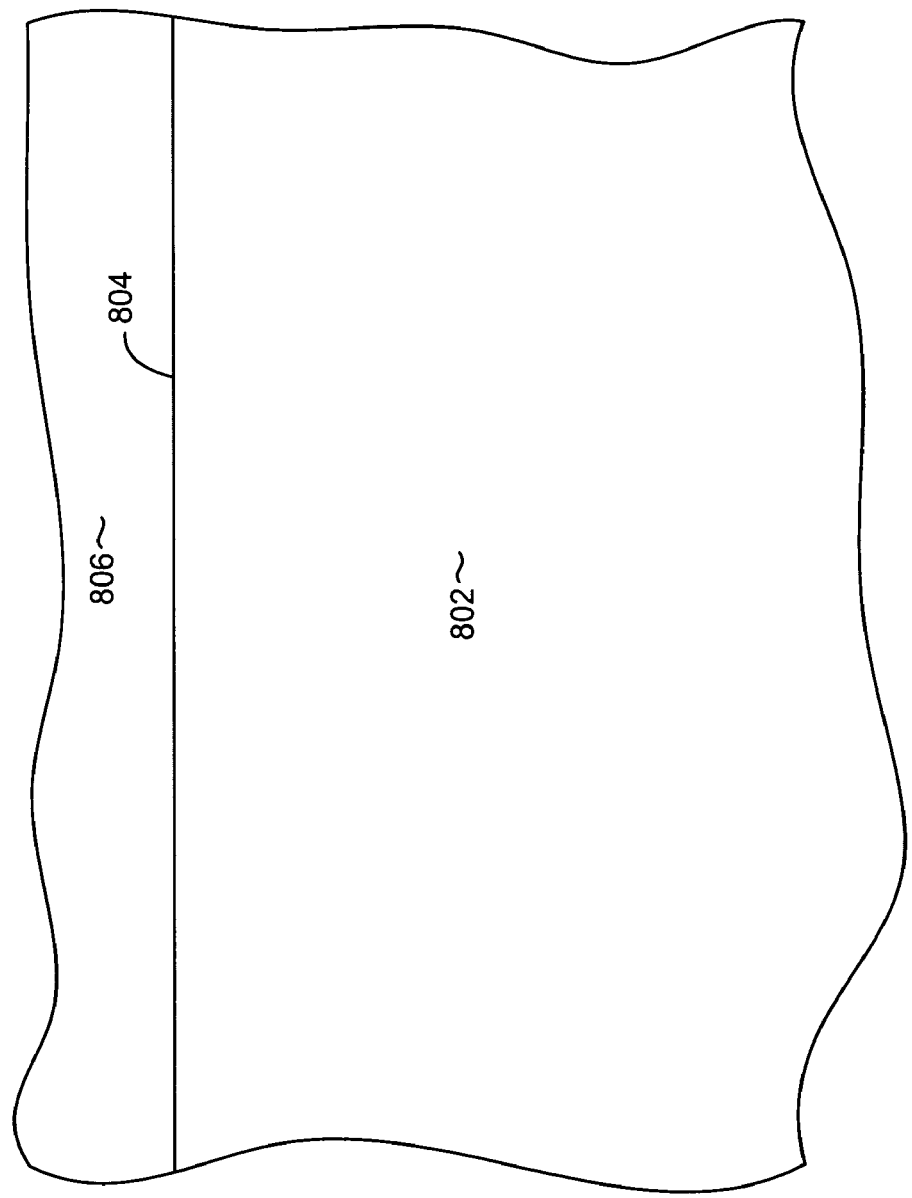

With reference now to FIG. 8, a back pinned layer stripe height defining mask structure 802 (first mask structure 802) is constructed. This mask structure 802 has a back edge 804 that determines the location of the back edge or stripe height of the pinned layer at SH1 as described above. An ion mill can be performed to remove the portions of the sensor layers beyond the back edge 804 of the mask structure 802, removing material down to the level of the substrate 704 (FIG. 7). A non-magnetic, electrically insulating fill layer 806 can then be deposited where the sensor material was removed.

Figure 9:
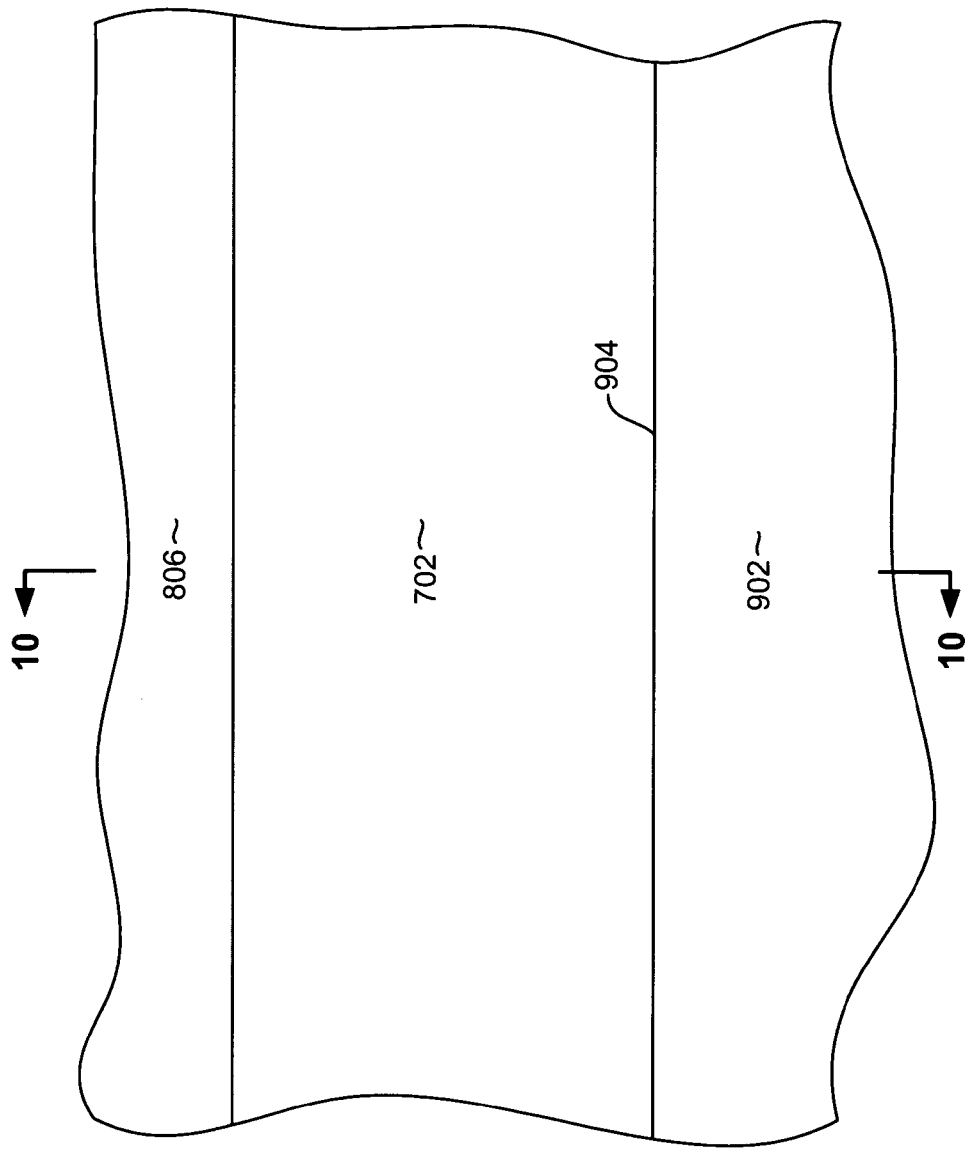
Figure 10:
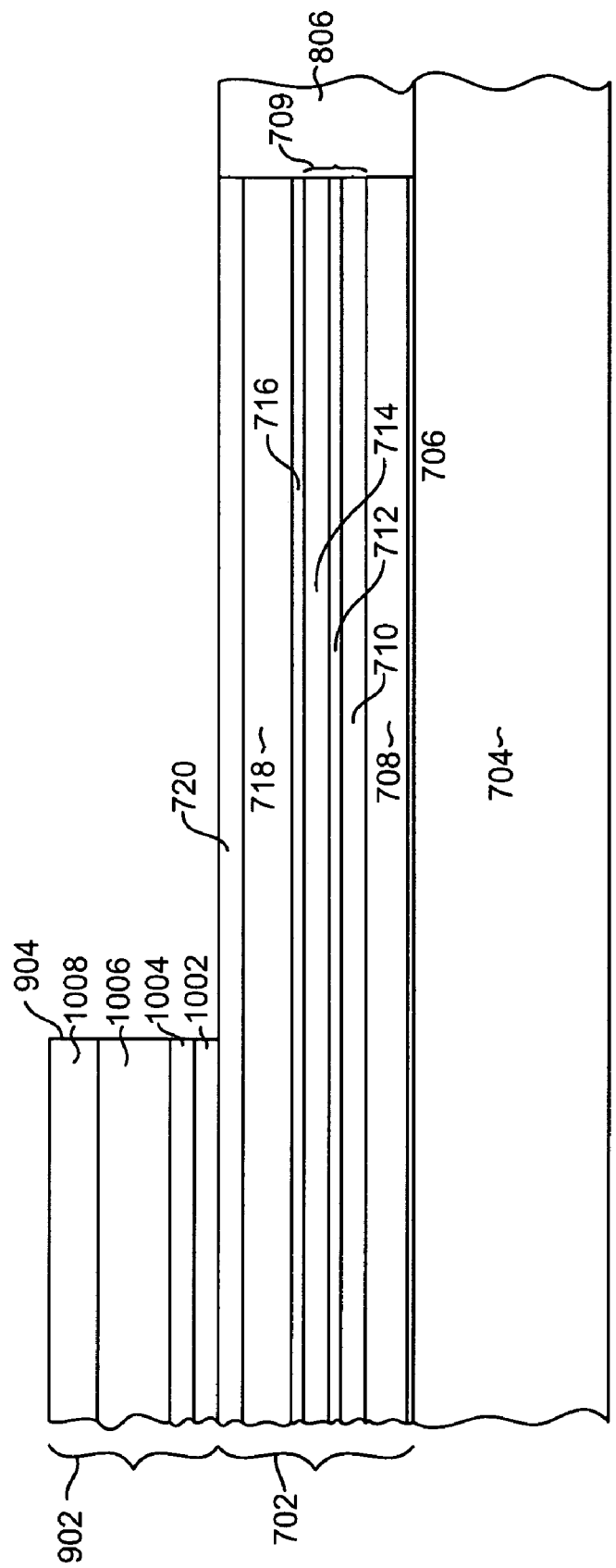

With reference now to FIG. 9, the first mask structure 802 is removed, such as by a chemical mechanical polishing (CMP) liftoff, and a second mask structure 902 is deposited. This second mask structure 902 has a back edge 904 that determines the location of the stripe height (SH2) of the free layer, as will become clearer below. This mask structure can be understood more clearly with reference to FIG. 10, where it can be seen that the mask 902 includes a first layer 1002 constructed of a material that is resistant to chemical mechanical polishing, preferably diamond like carbon (DLC). Although other materials could be suitable, this layer will be referred to as DLC layer 1002. A second layer 1004 is formed over the DLC layer 1002 and is constructed of a material that is resistant to both ion milling and chemical mechanical polishing and is preferably constructed of Rh. Although other materials could be used, this layer will be referred to as Rh layer 1004. Preferably, the DLC layer 1002 can have a thickness of about 200 Angstroms and the Rh layer 1004 can have a thickness of about 50 Angstroms. The mask 902 also preferably includes an image transfer layer 1006 formed over the Rh layer 1004. The image transfer layer can be constructed of a soluble polyimide material such as DURIMIDE®. The mask structure 902 further includes a photosensitive layer such as photoresist 1008 at the top of the mask structure 902. The mask 902 can be formed by depositing the mask layers 1002-1008 as full film layers, then photolithographically patterning and developing the photoresist layer 1008. The image of the photoresist layer can then be transferred to the underlying layers by one or more material removal processes, such as reactive ion etching (RIE) and ion milling.

Figure 11:
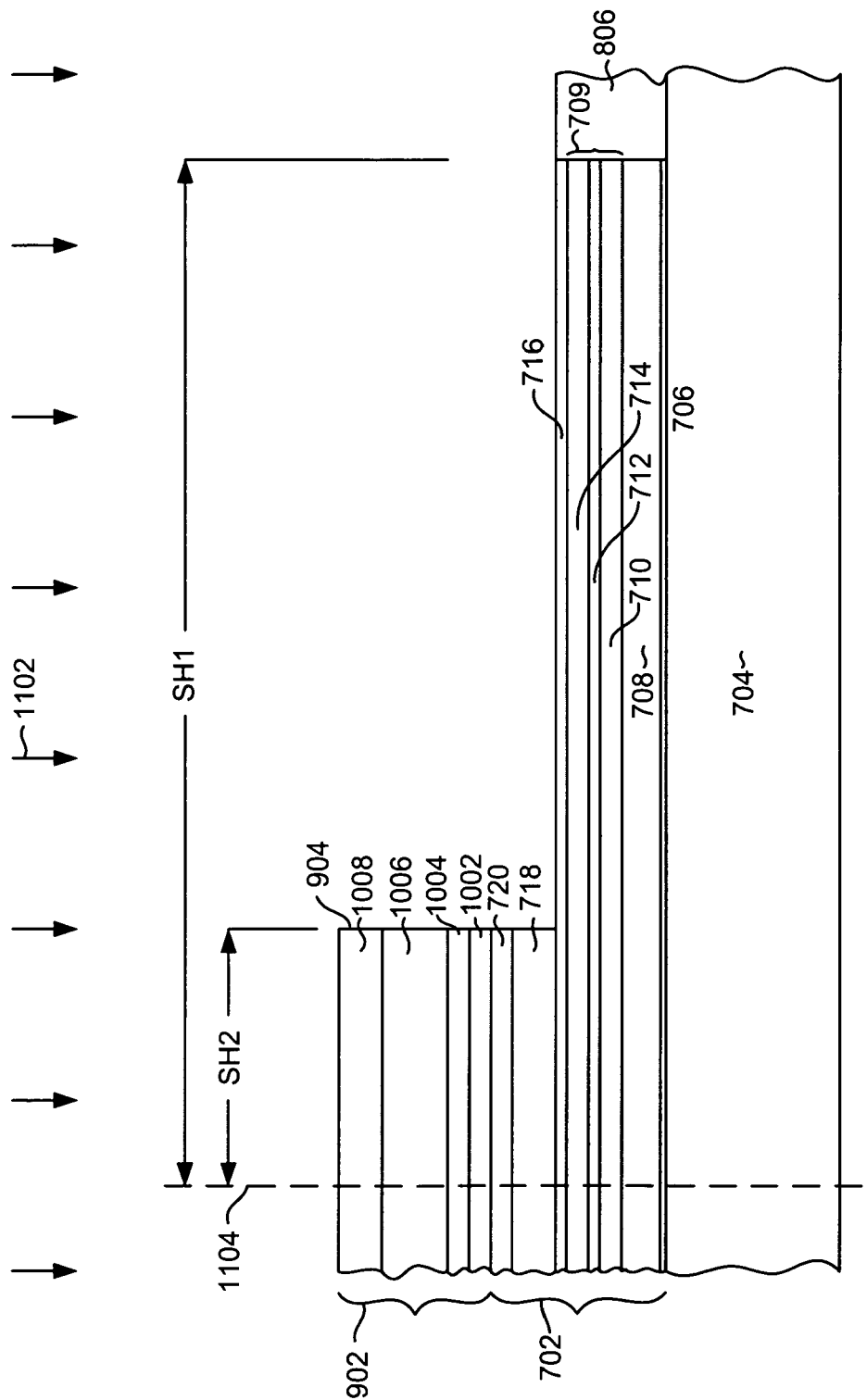

With reference now to FIG. 11, an ion mill 1102 is performed just sufficiently to remove the capping layer 720 and the free layer 718. The ion milling 1102 is preferably stopped when the spacer layer 716 is reached. This results in a pinned layer structure 709 that extends to a first stripe height distance SH1 measured from an intended ABS location 1104 (the actual ABS not having been formed yet) and a free layer that extends to a shorter stripe height SH2.

Figure 12:
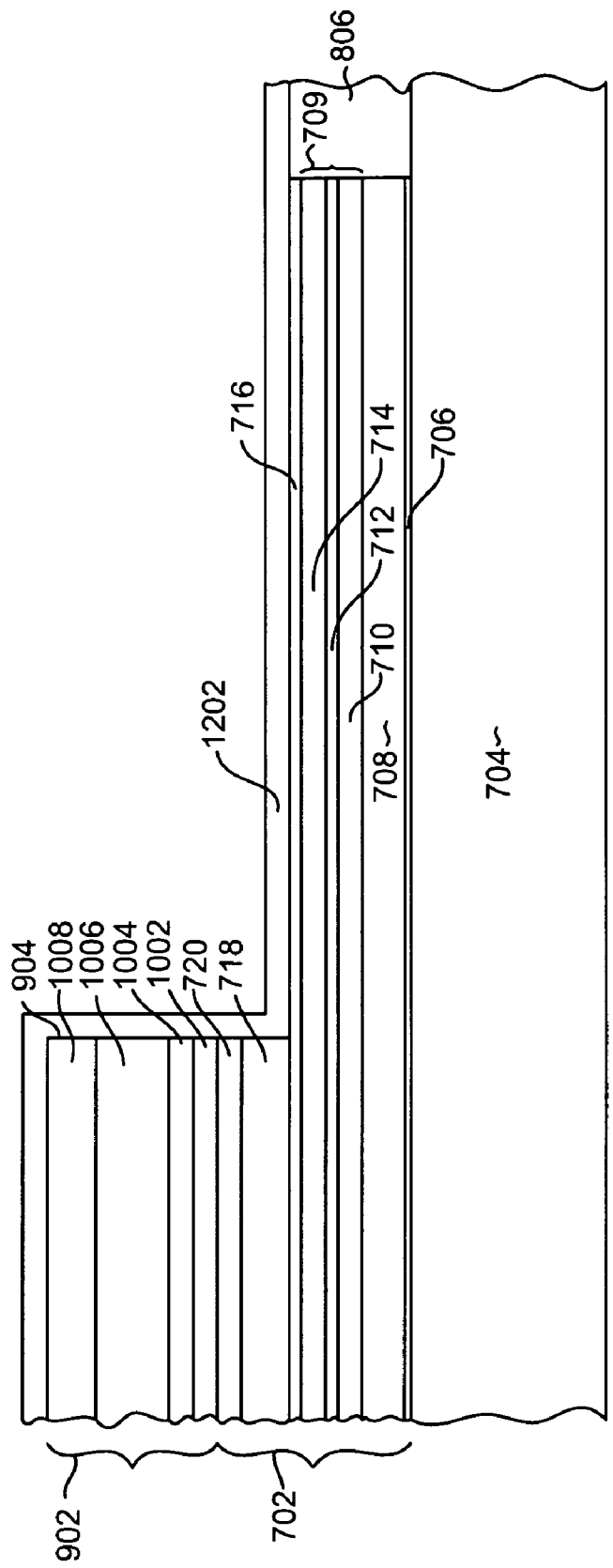
Figure 13:
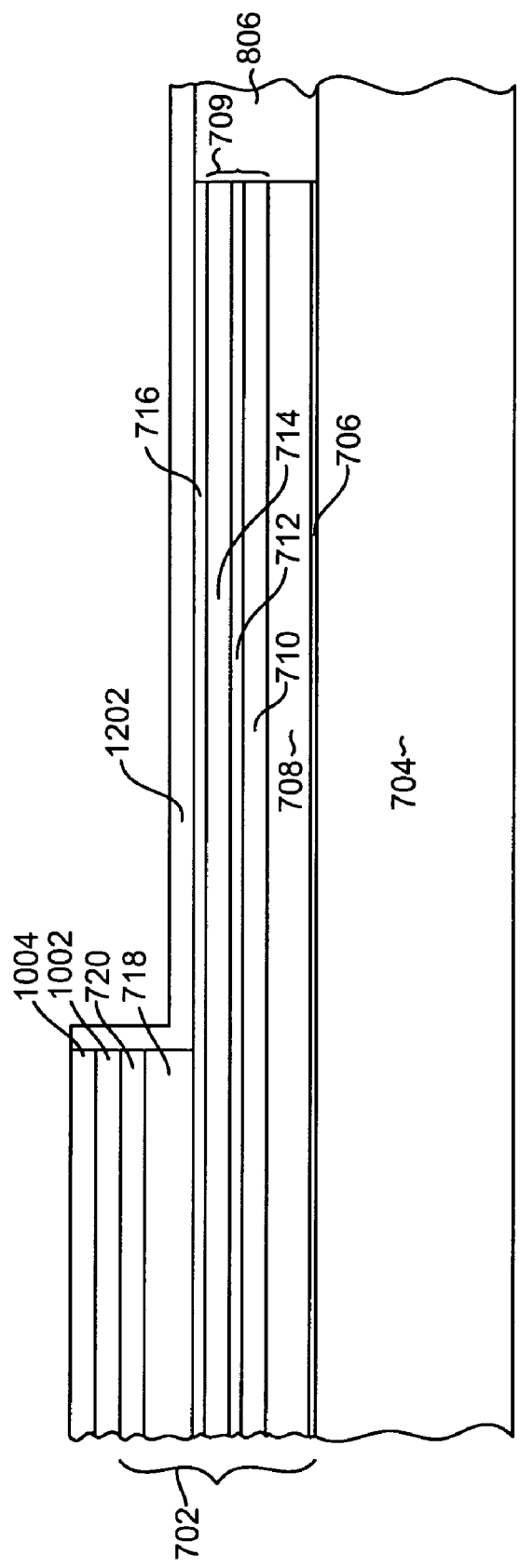
Figure 14:
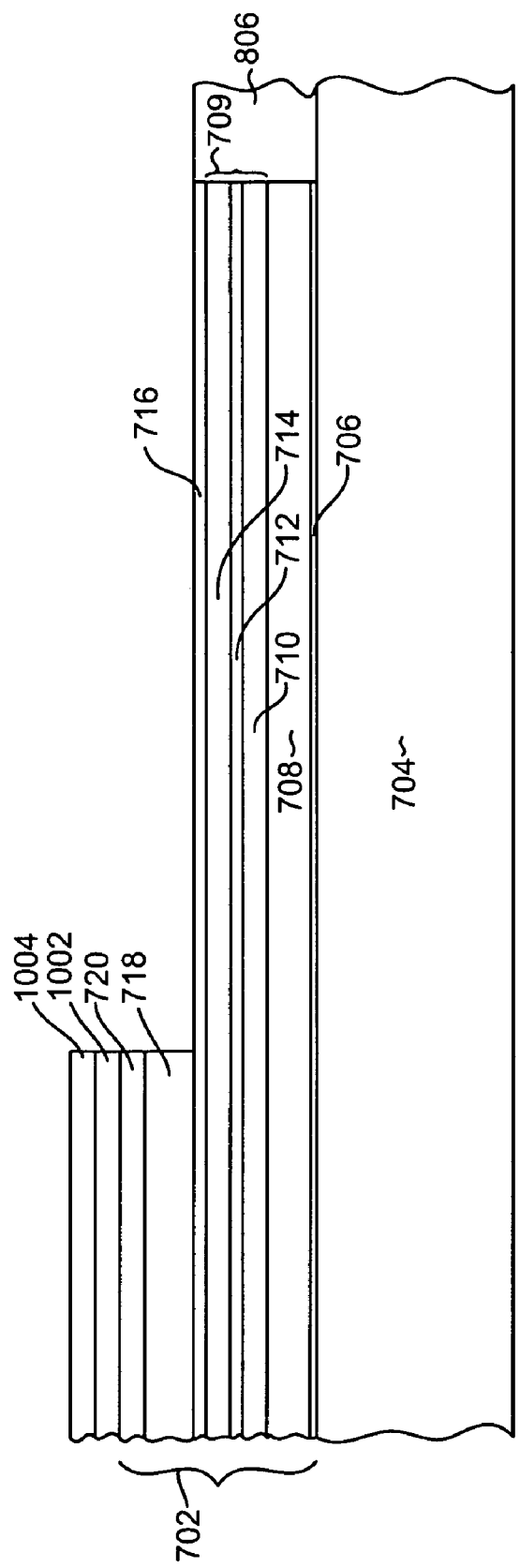

With reference to FIG. 12, a layer of CMP resistant material such as diamond like carbon (DLC) 1202 is deposited. Then, with reference to FIG. 13, a chemical mechanical polish (CMP) can be performed. With reference to FIG. 14, the remaining second deposited DLC layer 1202 can be removed, such as by reactive ion etching. The DLC layer 1002 that is protected by the Rh layer 1004 remains intact.

Figure 15:
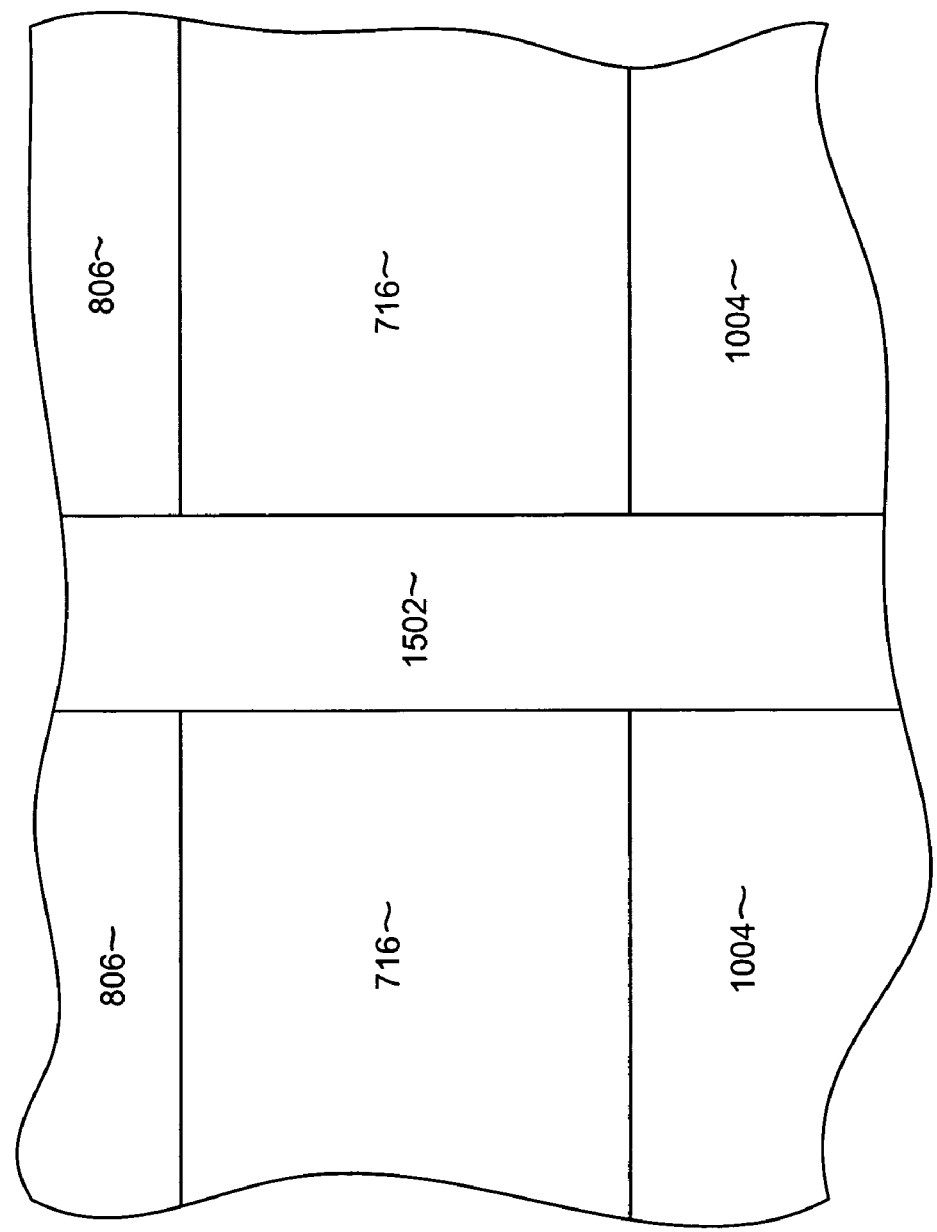
Figure 16:
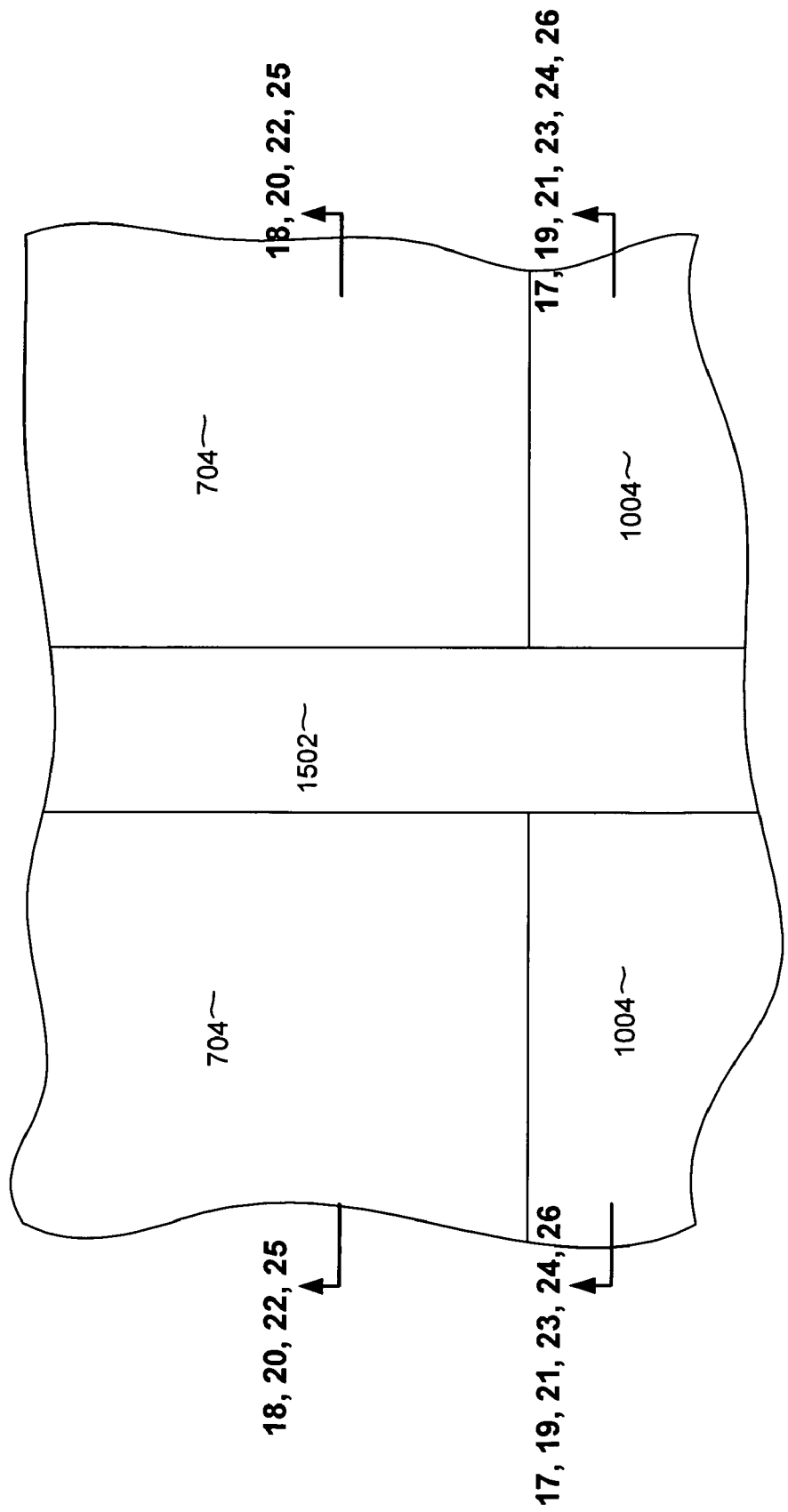

With reference now to FIG. 15, a third mask structure 1502 is formed. This third mask structure 1502 is a track width defining mask structure. Then with reference to FIG. 16, an ion mill 1802 (shown in FIG. 18) is performed to remove portions of the sensors 702 and fill layer 802 that are not protected by either of the mask structures 1502 or 1004. The ion mill is performed down to the level of the substrate 704. The illustration of FIG. 16 shows the location from which the various sections shown in FIGS. 17-26 are taken. More specifically FIGS. 18, 20, 22 and 25 are sections taken from the area beyond the stripe height of the free layer 718, whereas FIGS. 17, 19, 21, 23, 24 and 26 are taken from the location under the mask layer 1004 where the free layer remains.

Figure 17:
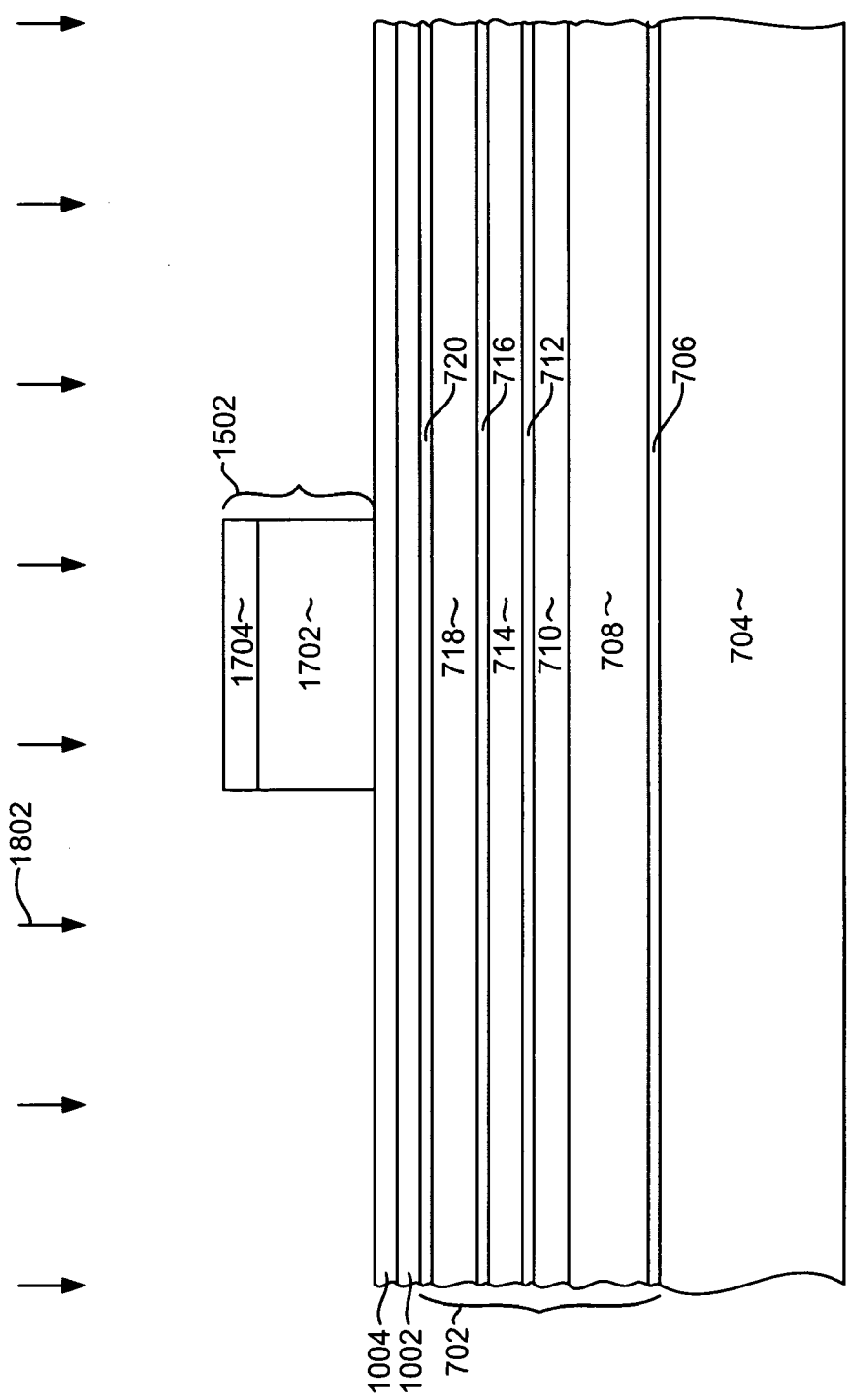
Figure 18:
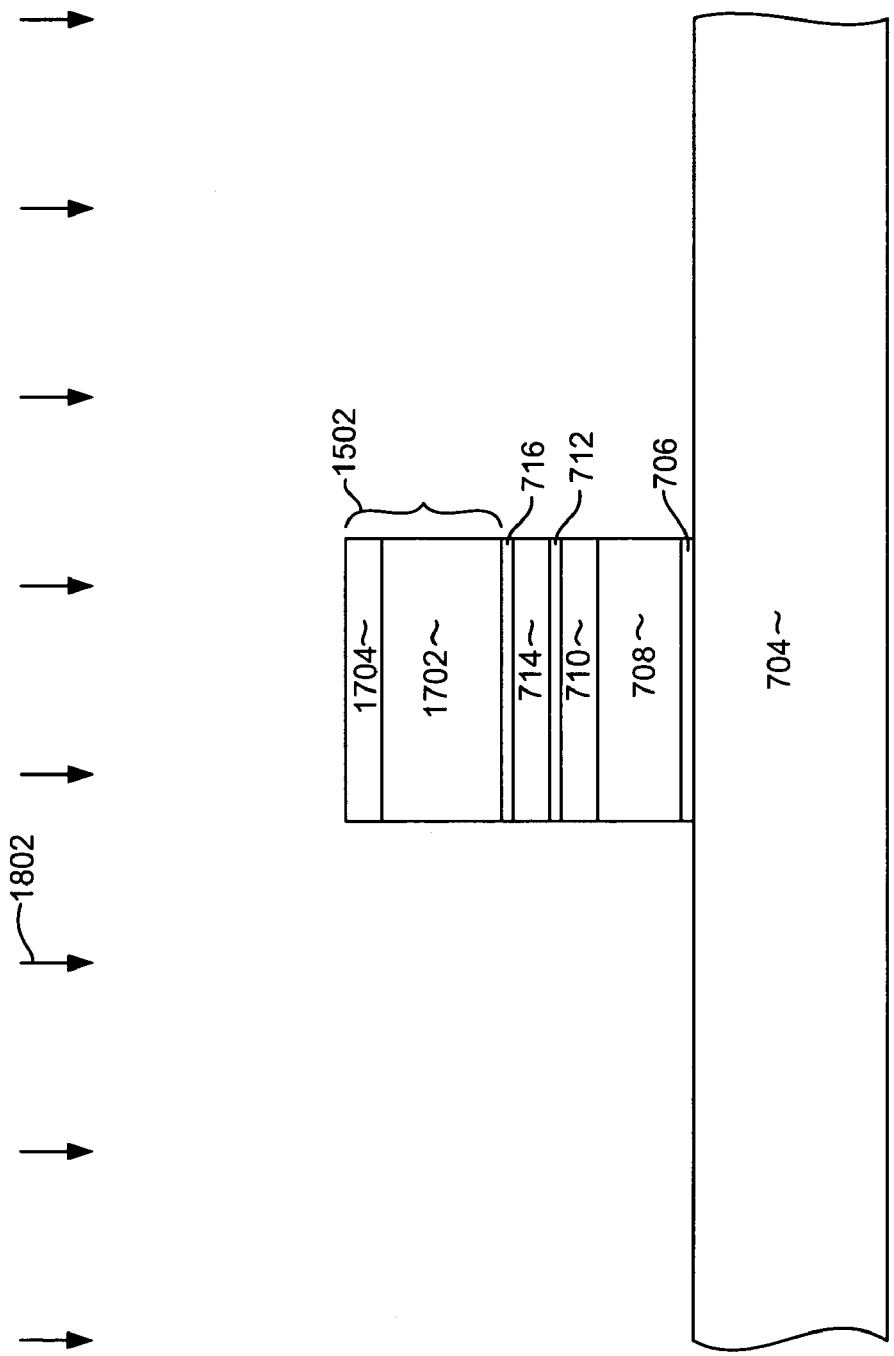
Figure 19:
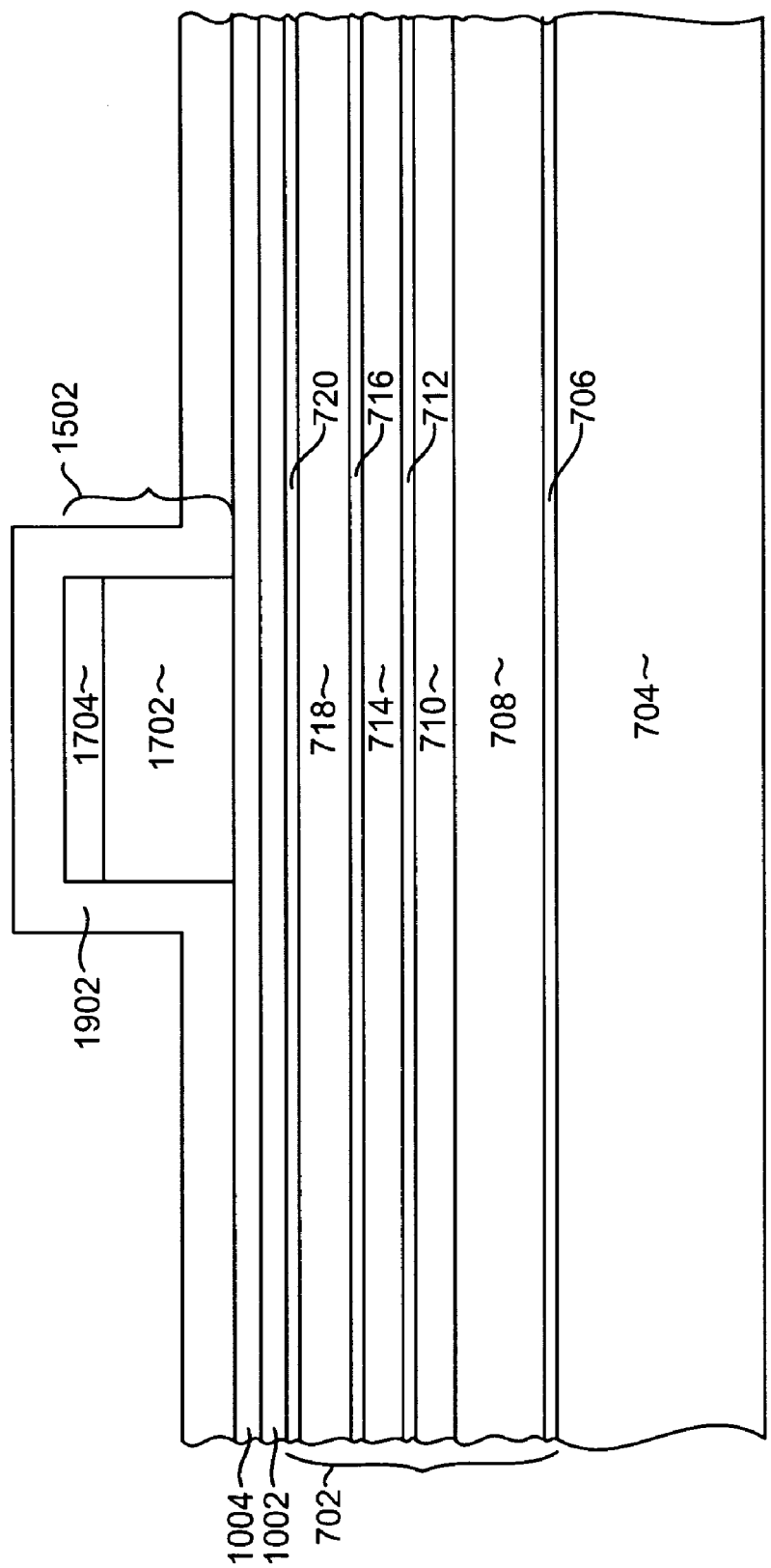
Figure 20:
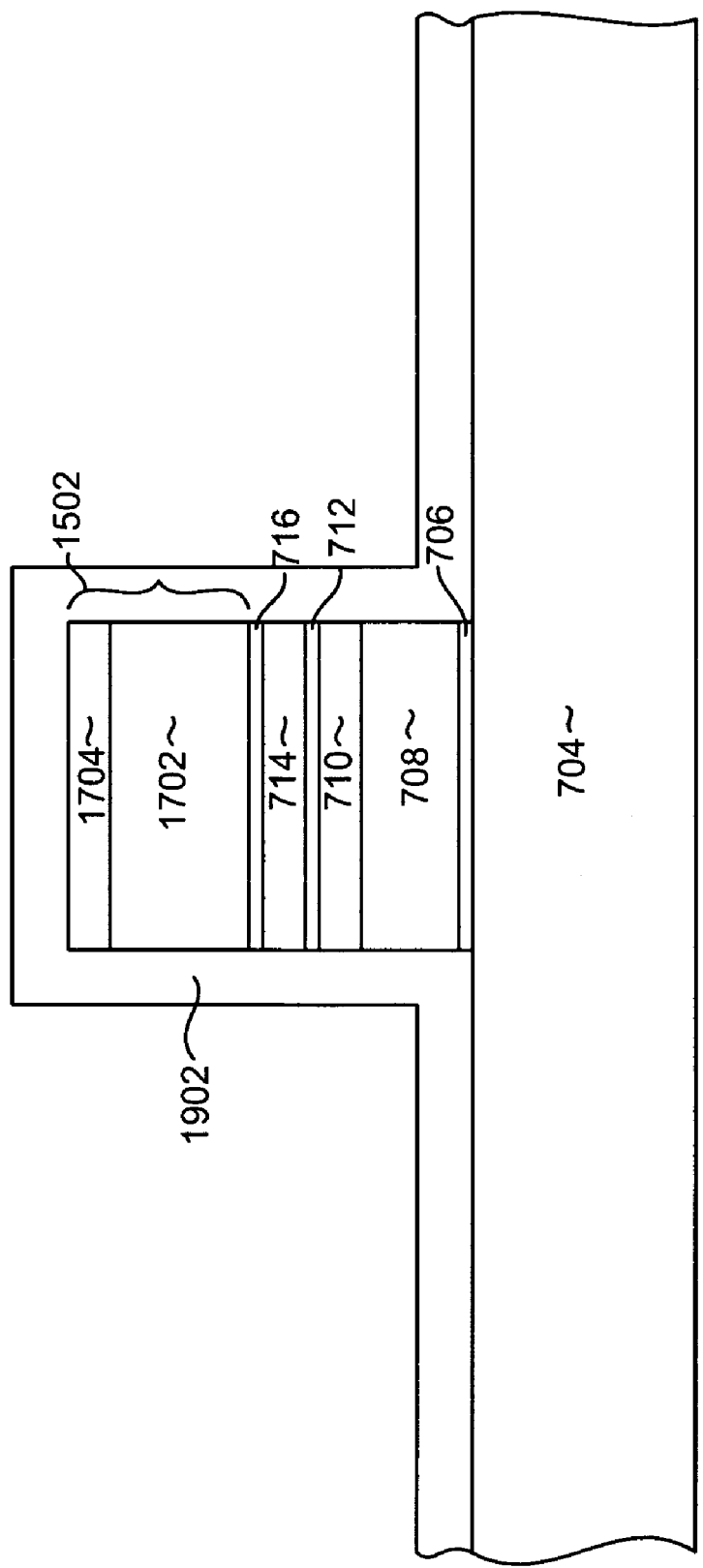

With reference to FIG. 18, the ion mill 1802 removes the remaining sensor layers (AFM) 708, pinned layer 709, and spacer layer 706, down to the level of the substrate 704. The portions of these layers that are protected by the mask 1502 remain. The mask 1502 can include an image transfer layer 1702 and a photoresist layer 1704. With reference to FIG. 17, it can be seen that the sensor layers in this region are protected by the DLC layer 1002 and Rh layer 1004, and are, therefore, not removed by the ion mill 1802: With reference now to FIGS. 19 and 20, a layer of hard material such as alumina 1902 is conformally deposited. This layer will be referred to as an alumina layer 1902 and is preferably deposited by a conformal deposition method such as atomic layer deposition (ALD), chemical vapor deposition (CVD), etc.

Figure 21:
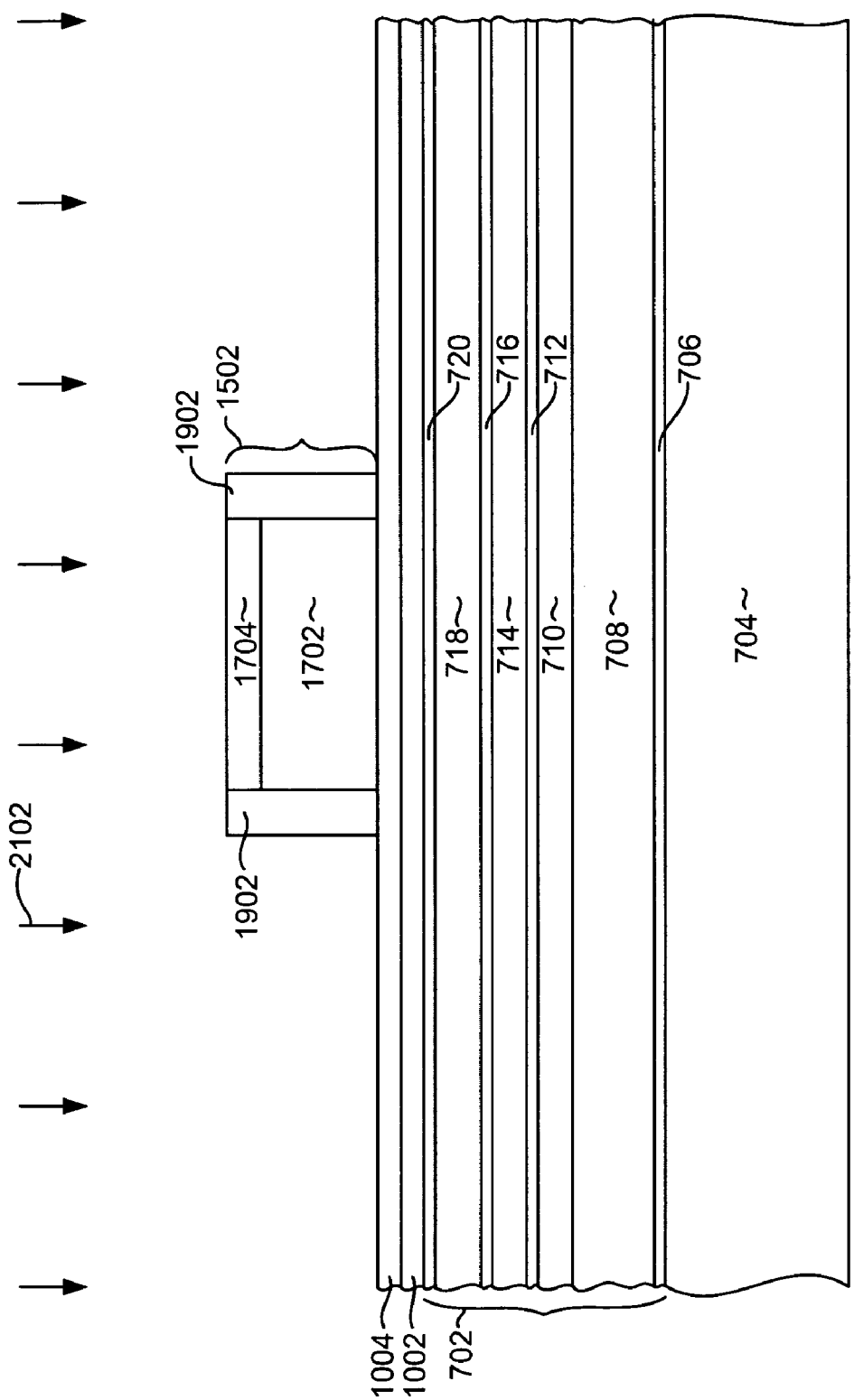
Figure 22:
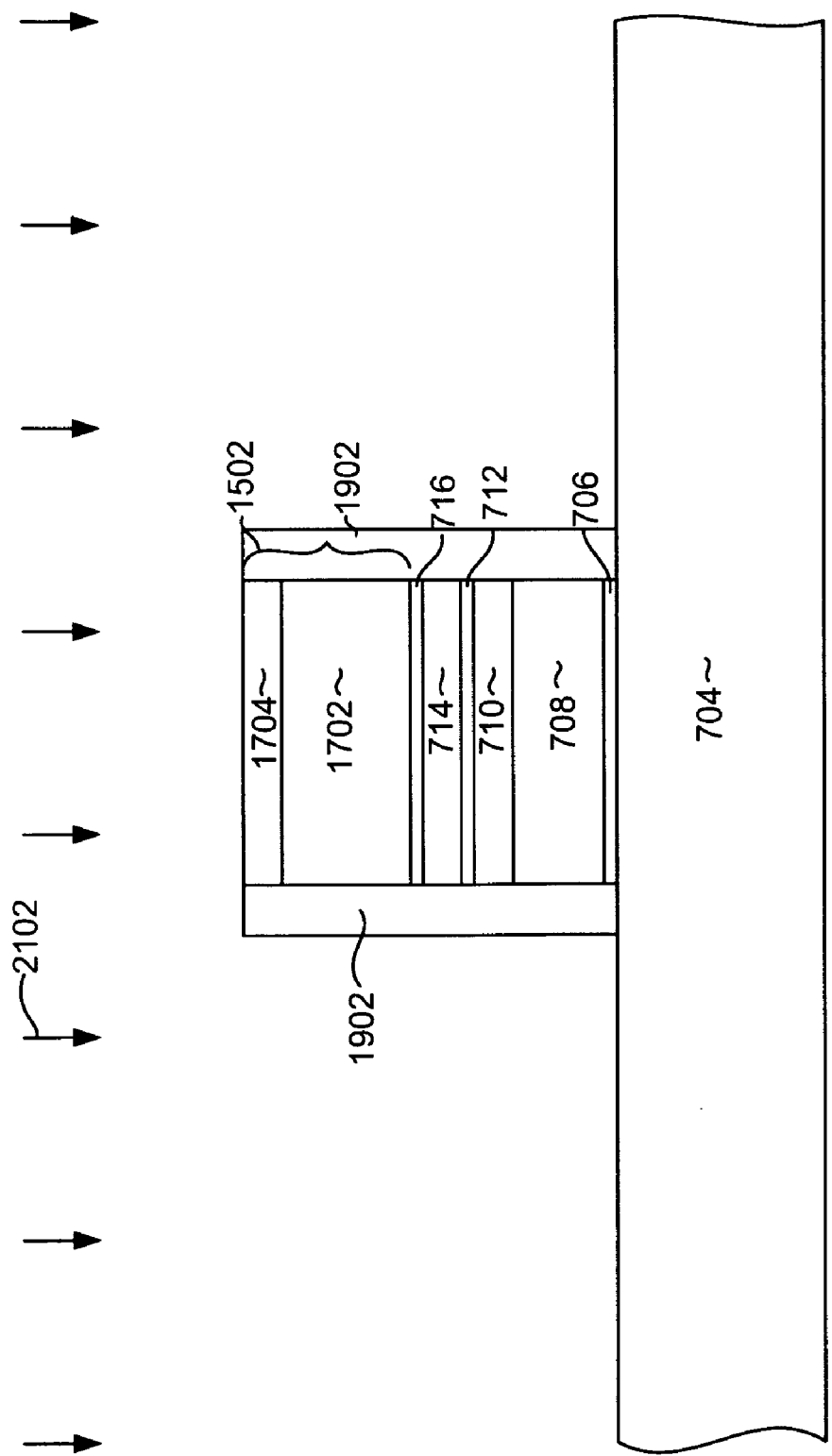

With reference now to FIGS. 21 and 22 an ion mill 2102 is performed to preferentially remove horizontally disposed portions of the conformally deposited alumina layer resulting in alumina side walls 1902.

Figure 23:
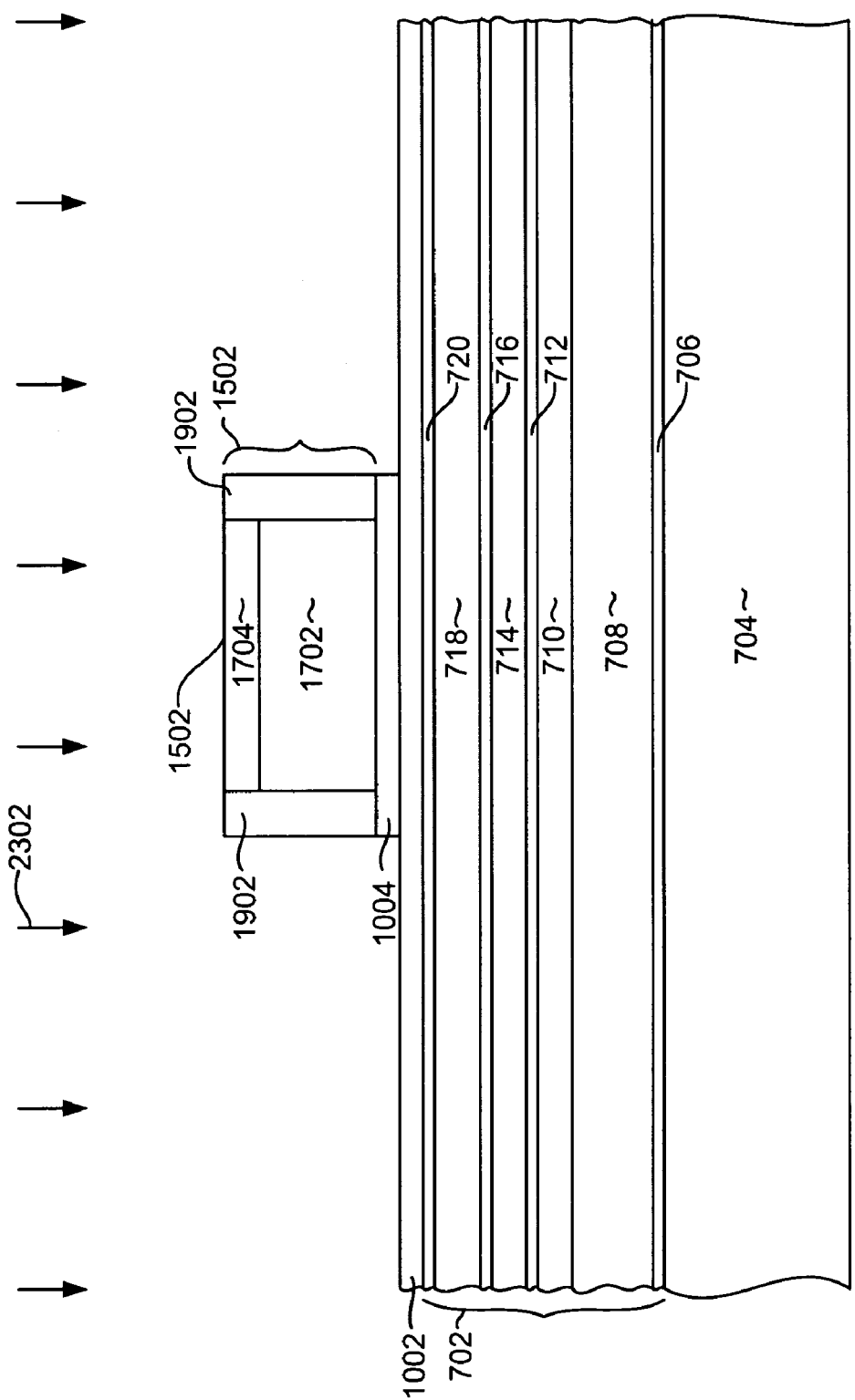
Figure 24:
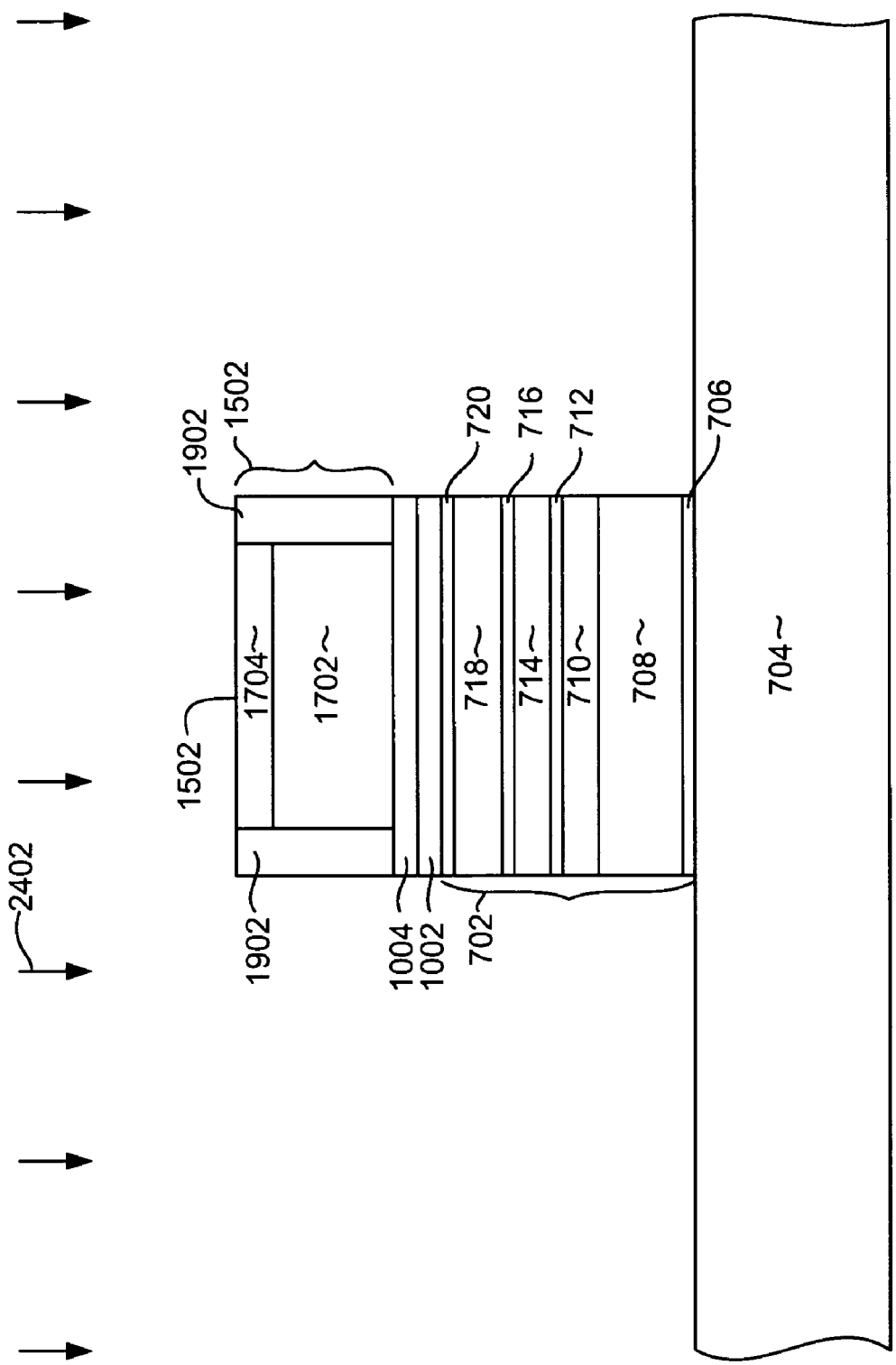

With reference now to FIG. 23, an ion mill and reactive ion etch (RIE) 2302 is performed to remove the Rh layer 1004 and the DLC layer 1002 exposed in regions that are not protected by the mask 1502 and side walls 1902. Then, with reference to FIG. 24, an ion mill 2402 is performed to remove portions of the sensor layers 702 that are not protected by the mask 1502 and side walls 1902.

Figure 25:
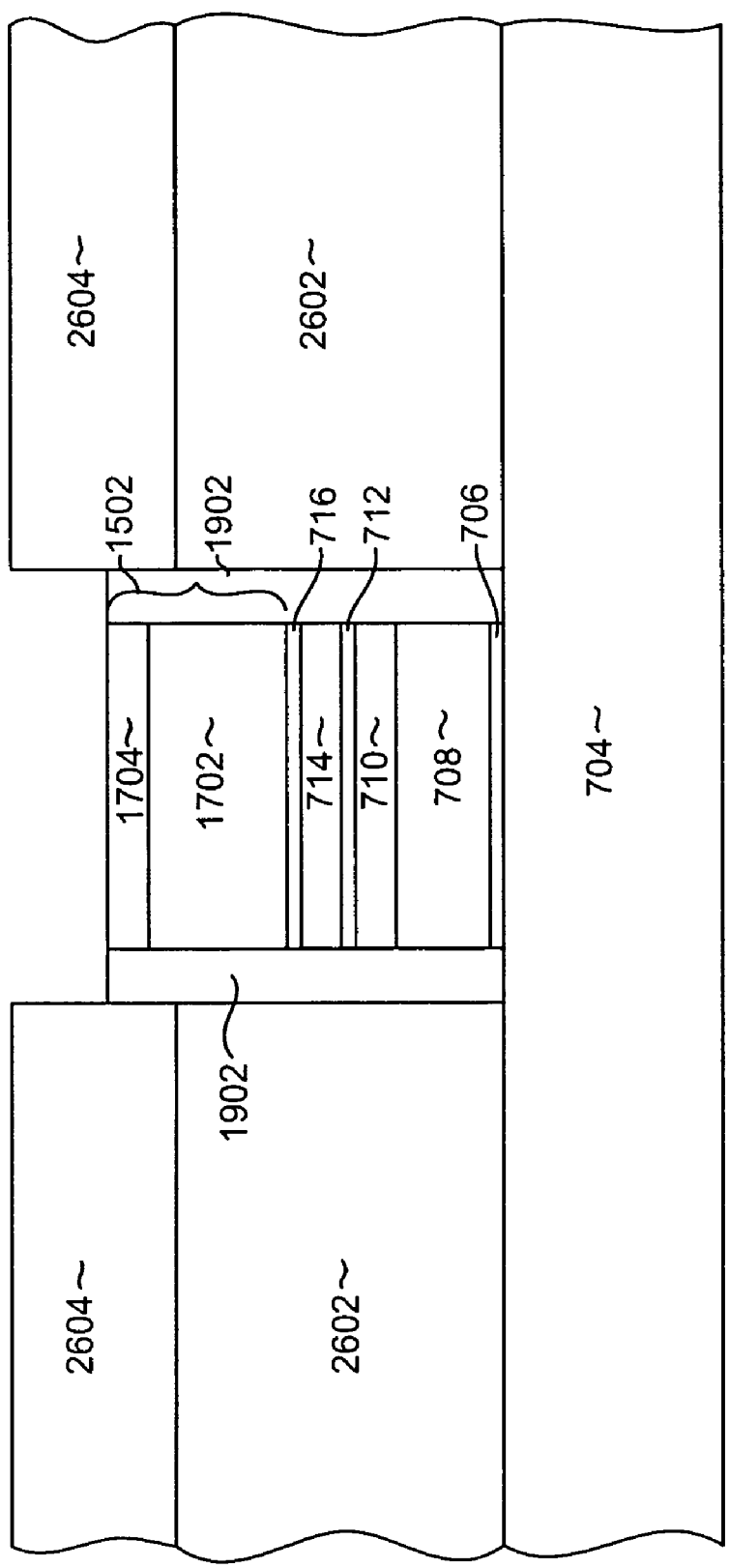
Figure 26:
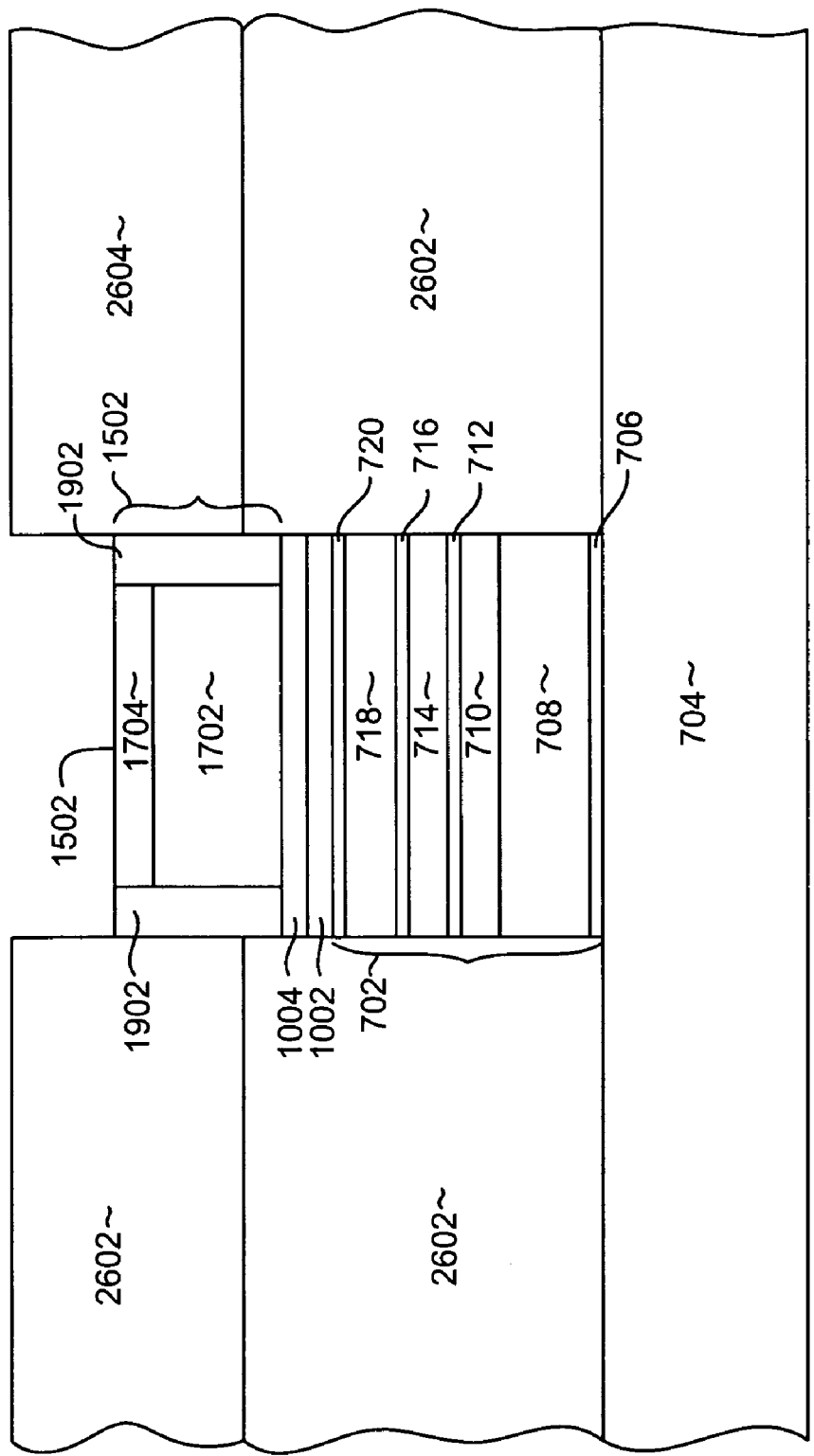

With reference to FIGS. 25 and 26, a hard magnetic bias material such as CoPtCr or some other electrically conductive, hard magnetic material 2602 is deposited, followed by an electrically conductive lead material 2604 such as Cu, Au, Rh etc. It can be seen with reference to FIGS. 25 and 26 that in regions within the active area of the sensor (ie. where the free layer 718 remains) the hard bias layers 2602 and leads 2604 are in contact with the sensor stack as shown in FIG. 26. However, in regions beyond the active area (where the free layer has been removed), the remaining sensor layers 706-716 are separated from the hard bias and lead layers 2602, 2604 by the alumina side walls 1902.

This self aligned process allows the hard bias and lead layers to extend along the sides of the pinned layer for improved conduction of sense current, without shunting the sense current through the remaining sensor layers in the inactive region of the sensor. This also allows the pinned layer 709 to be extended in the stripe height direction for improved shape enhanced pinning without shunting any sense current through the pinned layer.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor having an air bearing surface (ABS), comprising:
    a sensor stack that includes a magnetic free layer, a magnetic pinned layer structure, and a non-magnetic, electrically conductive spacer layer sandwiched between the free layer and the pinned layer structure, the sensor stack having first and second laterally opposed sides that are oriented substantially perpendicular to the ABS;
    first and second hard bias layers disposed adjacent to and extending laterally from the laterally opposed sides of the sensor stack; and
    first and second electrically conductive leads formed over the hard bias layers;
    wherein the free layer has a back edge, opposite the ABS that defines a stripe height of the sensor (free layer defined stripe height);
    wherein the pinned layer extends beyond the free layer defined stripe height;
    wherein the hard bias and lead layers extend beyond the free layer defined stripe height; and
    wherein the hard bias layers are electrically insulated from portions of the pinned layer that extend beyond the free layer defined stripe height.

2. A sensor as in claim 1 wherein the first and second hard bias layers contact the sensor stack in a region between the ABS and free layer defined stripe height.

3. A sensor as in claim 1 wherein the pinned layer extends to a first stripe height (SH1) measured from the ABS and the free layer extends to a second stripe height (SH2) as measured from the ABS, and wherein SH1 is at least twice SH2.

4. A sensor as in claim 1, further comprising a layer of electrically insulating, non-magnetic material disposed between the hard bias layer and the pinned layer in regions beyond the free layer defined stripe height.

5. A sensor as in claim 1 wherein the hard bias layers and the electrically conductive leads are both electrically insulated from the pinned layer in regions beyond the free layer defined stripe height.

6. A sensor as in claim 1 wherein the pinned extends a distance (SH1) from the ABS and wherein the hard bias and lead layers extend from the ABS a distance of at least SH1.

7. A sensor as in claim 1 wherein the pinned layer extends a distance (SH1) from the ABS and the free layer extends a distance SH2 from the ABS, wherein SH1 is at least twice SH2 and wherein the hard bias and lead layers extend from the ABS to a distance of at least SH1.

8. A sensor as in claim 1 wherein the pinned layer extends a distance (SH1) from the ABS and the free layer extends a distance SH2 from the ABS, wherein SH1 is at least twice SH2 and wherein the hard bias and lead layers extend beyond SH1.

9. A magnetoresistive sensor having an air bearing surface ABS, the magnetoresistive sensor comprising:
a sensor stack having a magnetic free layer a magnetic pinned layer structure and a non-magnetic, electrically conductive spacer layer sandwiched between the free layer and the pinned layer, the sensor stack having first and second laterally opposed side walls, the free layer extending to a distance from the ABS that defines a stripe height (free layer defined stripe height), the pinned layer extending beyond the free layer defined stripe height;
first and second electrically conductive, magnetic bias layers contacting the first and second sides of the sensor stack and extending laterally therefrom, the first and second magnetic bias layers extending beyond the stripe height defined by the free layer; and
first and second non-magnetic, electrically insulating walls disposed between the pinned layer and the magnetic bias layers in regions beyond the free layer defined stripe height.

10. A sensor as in claim 9 wherein the non-magnetic, electrically insulating walls comprise alumina.

11. A sensor as in claim 9 wherein the non-magnetic, electrically insulating side walls extend over the sensor stack in the region between the ABS and the free layer defined stripe height.

12. A sensor as in claim 9 wherein the sensor stack has a width defined by the distance between the first and second laterally opposed sides of the sensor stack, and wherein the pinned layer has a width in the region beyond the free layer defined stripe height that is less than the width of the sensor stack.

13. A sensor as in claim 9 wherein the sensor stack has a width defined by the distance between the first and second laterally opposed sides of the sensor stack, and wherein the pinned layer has a width in the region beyond the free layer defined stripe height that is less than the width of the sensor stack by an amount that is substantially equal to a sum of the thicknesses of the first and second non-magnetic, electrically insulating side walls.

14. A sensor as in claim 9 wherein the pinned layer structure extends from the ABS to first stripe height distance SH1, and the free layer extends from the ABS a second stripe height distance SH2, and wherein SH1 is at least twice SH2.

* * * * *